United States Patent [19]
Torimaru et al.

[11] Patent Number: 5,821,783
[45] Date of Patent: Oct. 13, 1998

[54] BUFFER CIRCUITS WITH CHANGEABLE DRIVE CHARACTERISTIC

[75] Inventors: Yasuo Torimaru, Nara-ken; Atsushi Semi, Osaka; Kaneo Kawaishi, Nara-ken, all of Japan

[73] Assignee: Sharp Kabushiki Kaisha, Osaka, Japan

[21] Appl. No.: 778,695

[22] Filed: Jan. 3, 1997

Related U.S. Application Data

[63] Continuation of Ser. No. 277,346, Jul. 19, 1994, abandoned.

[30] Foreign Application Priority Data

Jul. 19, 1993 [JP] Japan .................................. 5-178365

[51] Int. Cl.$^6$ .................................................. H03B 1/00
[52] U.S. Cl. .......................................... 327/108; 326/87
[58] Field of Search ................................ 326/82, 85, 87, 326/104, 112, 119, 120, 121, 122; 327/108, 525, 526, 529, 170

[56] References Cited

U.S. PATENT DOCUMENTS

| | | | |
|---|---|---|---|
| 4,104,546 | 8/1978 | Seiler ....................................... | 327/525 |
| 4,608,530 | 8/1986 | Bacrania ................................. | 327/525 |
| 4,700,089 | 10/1987 | Fujii et al. ............................. | 326/121 |
| 4,829,481 | 5/1989 | Johnson et al. ......................... | 327/525 |
| 5,041,738 | 8/1991 | Walters, Jr. ............................. | 327/170 |
| 5,061,864 | 10/1991 | Rogers ..................................... | 326/87 |
| 5,134,311 | 7/1992 | Biber et al. ............................. | 327/108 |
| 5,149,990 | 9/1992 | Yamazaki et al. ...................... | 307/443 |
| 5,153,450 | 10/1992 | Ruetz ....................................... | 326/87 |
| 5,194,765 | 3/1993 | Dunlop et al. ........................... | 326/87 |
| 5,216,289 | 6/1993 | Hahn et al. .............................. | 327/108 |
| 5,220,216 | 6/1993 | Woo ......................................... | 326/87 |
| 5,220,221 | 6/1993 | Casper ..................................... | 327/170 |
| 5,227,679 | 7/1993 | Woo ......................................... | 326/121 |
| 5,278,460 | 1/1994 | Casper ..................................... | 326/121 |
| 5,285,116 | 2/1994 | Thaik ....................................... | 327/170 |
| 5,329,174 | 7/1994 | Chiang .................................... | 307/443 |
| 5,361,001 | 11/1994 | Stolfa ...................................... | 327/525 |
| 5,402,018 | 3/1995 | Koyanagi ................................. | 326/112 |
| 5,420,526 | 5/1995 | Fensch ..................................... | 326/30 |
| 5,436,578 | 7/1995 | Brown et al. ............................ | 326/87 |
| 5,450,030 | 9/1995 | Shin et al. ............................... | 327/525 |

FOREIGN PATENT DOCUMENTS

| | | |
|---|---|---|
| 58-196725 | 11/1983 | Japan . |
| 58-196726 | 11/1983 | Japan . |
| 64-57491 | 3/1989 | Japan . |

OTHER PUBLICATIONS

Sedra & Smith, Microelectronic Circuits, Chap. 13 1991 Saunders College Publishing, Philadelphia.

*Primary Examiner*—Timothy P. Callahan
*Assistant Examiner*—Jeffrey Zweizig
*Attorney, Agent, or Firm*—Morrison & Foerster

[57] ABSTRACT

A buffer circuit according to the present invention includes an input terminal for inputting an input signal, an inverter circuit for inverting the input signal and outputting the inverted input signal to an output terminal, wherein the inverter circuit has a plurality of PMOS transistors and a plurality of NMOS transistors; each of the plurality of PMOS transistors has a source connected to a power source, a drain connected to the output terminal, and a gate connected to the input terminal; each of the plurality of NMOS transistors has a source connected to a ground, a drain connected to the output terminal, and a gate connected to the input terminal; and the gate of at least one of the plurality of PMOS transistors and NMOS transistors is connected to the input terminal via a fuse element which can be selectively disconnected.

23 Claims, 19 Drawing Sheets

BUFFER CIRCUITS WITH CHANGEABLE DRIVE CHARACTERISTIC

This application is a file wrapper continuation of application Ser. No. 08/277,346, filed Jul. 19, 1994, now abandoned.

BACKGROUND OF THE INVENTION

1. Field of the Invention:

The present invention relates to a buffer circuit using an inverter such as a CMOS (Complementary Metal-Oxide-Semiconductor).

2. Description of the Related Art:

FIG. 18 shows an exemplary buffer circuit using a conventional CMOS inverter. The buffer circuit includes a set of a complementary P-channel MOS transistor $Q_P$ and N-channel MOS transistor $Q_N$. The P-channel MOS transistor $Q_P$ has a source connected to a power source $V_{DD}$, a drain connected to an output terminal 2, and a gate connected to an input terminal 1. The N-channel MOS transistor $Q_N$ has a source connected to a ground GND, a drain connected to the output terminal 2, and a gate connected to the input terminal 1. Accordingly, the buffer circuit functions as an inverter in which a logic level of the input terminal 1 is inverted and then outputted to the output terminal 2.

FIG. 19 shows another example of the buffer circuit using the conventional CMOS inverter. The buffer circuit of FIG. 19 is the same as that of FIG. 18 except that this buffer circuit includes a further set of a complementary P-channel MOS transistor $Q_{P0}$ and N-channel MOS transistor $Q_{N0}$. The P-channel MOS transistor $Q_{P0}$ has a drain connected to the output terminal 2, a source connected to the drain of the P-channel MOS transistor $Q_P$, and a gate connected to a control input terminal 3. The N-channel MOS transistor $Q_{N0}$ has a source connected to the ground GND, a drain connected to the output terminal 2, and a gate connected to the control input terminal 3. Accordingly, in the case where the control input terminal 3 is in a low level, the P-channel MOS transistor $Q_{P0}$ becomes ON and the N-channel MOS transistor $Q_{N0}$ becomes OFF. Therefore, the function of the inverter (i.e., inverting the logic level of the input terminal 1 and outputting the inverted level to the output terminal 2) becomes active. In the case where the control input terminal 3 is at a high level, the P-channel MOS transistor $Q_{P0}$ and the N-channel MOS transistor $Q_{N0}$ become OFF and ON, respectively, and the output terminal 2 is always in a low level, making the function of the inverter inactive. The P-channel MOS transistor $Q_P$ and the N-channel MOS transistor $Q_N$, which serve as a main PMOS and a main NMOS, respectively, in the buffer circuits of FIGS. 18 and 19, are designed so that the buffer circuits have desired circuit characteristics. However, the circuit characteristics are not always excellent because of unevenness of fabrication processes.

In the case of using the buffer circuit, for example, as an input buffer of a CMOS semiconductor memory device, an input inversion (inverting) voltage $V_{INV}$ should be set to be approximately in the range of 1.5 V to 1.6 V, in order to fit the logic level of a TTL (Transistor-Transistor-Logic) connected to the buffer circuit; and the circuit characteristics should be set so as to obtain the optimum noise margin. Here, the noise margin is defined as a difference between the input inversion voltage $V_{INV}$ and a high level or a low level of the logic level that is to be input. In a standard TTL level in the semiconductor memory device such as a SRAM (Static Random Access Memory), the high level is 2.2 V and the low level is 0.8 V. Thus, if the input inversion voltage $V_{INV}$ is set at 1.5 V, the noise margin of 0.7 V can be obtained at both high and low level sides.

The designing procedure of the buffer circuit will be described below, for setting the input inversion voltage $V_{INV}$ at a desired value.

First, a current IDP flowing through the P-channel MOS transistor $Q_P$ is represented by the following Equation (1):

$$I_{DP} = \frac{\beta_P}{2} (V_I - V_{DD} - V_{TP})^2 \qquad (1)$$

wherein, $V_I$ and $V_{DD}$ represent an input voltage and a source voltage of the buffer circuit, respectively, and $\beta_P$ and $V_{TP}$ represent a gain constant and a threshold voltage of the P-channel MOS transistor $Q_P$, respectively.

Furthermore, a current $I_{DN}$ flowing through the N-channel MOS transistor $Q_N$ is represented by the following Equation (2):

$$I_{DN} = \frac{\beta_N}{2} (V_I - V_{TN})^2 \qquad (2)$$

wherein, $\beta_N$ and $V_{TN}$ represent the gain constant and the threshold voltage of the N-channel MOS transistor $Q_N$, respectively.

When the input voltage $V_I$ coincides with the input inversion voltage $V_{INV}$, $I_{DP}$ equals $I_{DN}$. Then, the input voltage $V_I$ (i.e., the input inversion voltage $V_{INV}$) is represented by the following Equation (3), based on Equations (1) and (2).

$$V_{INV} = V_I = \frac{V_{DD} + V_{TN} \cdot \sqrt{\frac{\beta_N}{\beta_P}} + V_{TP}}{1 + \sqrt{\frac{\beta_N}{\beta_P}}} \qquad (3)$$

Accordingly, by selectively setting respective constants of the right side of the Equation (3), a desired input inversion voltage $V_{INV}$ can be obtained.

The gain constant $\beta_P$, which shows a drive ability of the P-channel MOS transistor $Q_P$, is represented by the following Equation (4):

$$\beta_P = \frac{W_P}{L_P} \cdot \mu_P \cdot C_O \qquad (4)$$

wherein, $C_O$, $W_P$, $L_P$, and $\mu_P$ represent a gate capacity for an unit area of the MOS transistor; a channel width (almost equal to a gate width), a channel length (almost equal to a gate length), and the mobility of carriers of the P-channel MOS transistor $Q_P$, respectively.

The gain constant $\beta_N$, which shows a drive ability of the N-channel MOS transistor $Q_N$, is represented by the following Equation (5):

$$\beta_N = \frac{W_N}{L_N} \cdot \mu_N \cdot C_O \qquad (5)$$

wherein, $W_N$, $L_N$, and $\mu_N$ represent a channel width, a channel length and the mobility of carriers of the N-channel MOS transistor $Q_N$.

Process constants such as the threshold voltages $V_{TP}$ and $V_{TN}$, the mobility of carriers $\mu_P$ and $\mu_N$, and the gate capacity $C_O$ are determined according to the fabrication processes. When the mobility of carriers $\mu_P$ and $\mu_N$ are equal, the gain constant ratio $\beta_N/\beta_P$ of the Equation (3) is represented by the following Equation (6):

$$\frac{\beta_N}{\beta_P} = \frac{L_P \cdot W_N}{W_P \cdot L_N} \quad (6)$$

Since the Equation (3) can be transformed by the following Equation (7), $$V_{INV} = V_I = \frac{V_{DD} + V_{TN} \cdot \sqrt{\frac{L_P \cdot W_N}{W_P \cdot L_N}} + V_{TP}}{1 + \sqrt{\frac{L_P \cdot W_N}{W_P \cdot L_N}}} \quad (7)$$

the input inversion voltage $V_{INV}$ can be adjusted depending on the channel widths $W_P$ and $W_N$, and the channel lengths $L_P$ and $L_N$. Accordingly, in order to set the input inversion voltage $V_{INV}$ to be a desired value, the gain contrast ratio $\beta_N/\beta_P$ should be adjusted by selectively setting the channel widths $W_P$ and $W_N$ and the channel lengths $L_P$ and $L_N$.

For example, in the case where the power source $V_{DD}$ is 5 V and the threshold voltages $V_{TN}$ and $V_{TP}$ are 0.8 V and −0.8 V, respectively, by selectively setting the channel widths $W_P$ and $W_N$ and the channel lengths $L_P$ and $L_N$, the gain constant ratio $\beta_N/\beta_P$ is adjusted so as to be 14.9. As a result, the input inversion voltage $V_{INV}$ can be set to be 1.5 V from Equation (3).

However, although the buffer circuit is fabricated by setting the channel widths $W_P$ and $W_N$ and the channel lengths $L_P$ and $L_N$ in the above-mentioned manner, in reality, the above process constants may be changed due to the unevenness of the fabrication processes. When the input inversion voltage $V_{INV}$ is out of a desired value because of the unevenness, the noise margin will be deteriorated. For example, when the threshold voltages $V_{TN}$ and $V_{TP}$ become 0.6 V and −1.0 V, respectively, due to the change of the process constants according to Equation (3), the input inversion voltage $V_{INV}$ is changed to 1.3 V, and the noise margin on the low level side is reduced to 0.5 V. Alternatively, when the threshold voltages $V_{TN}$ and $V_{TP}$ become 1.0 V and −0.6 V, respectively, the input inversion voltage $V_{INV}$ is changed to 1.7 V, and the noise margin on the high level side is reduced to 0.5 V.

As mentioned above, in the case where the buffer circuit is used as an input buffer of a semiconductor integrated circuit, the noise margin cannot be sufficiently obtained due to the unevenness of the circuit characteristics caused by the fabrication processes.

Alternatively, in the case where the buffer circuit is used as an output buffer of the semiconductor integrated circuit, it is necessary to get the drive ability which can drive a rear circuit even if the unevenness of the process constants becomes worse. When the process constants are varied so that the drive ability of the buffer circuit has its maximum value, the noise margin cannot be sufficiently obtained.

As shown in FIG. 20, a series parasitic inductance L occurs on a bonding wire or the like ex t ended from a ground line 21 connected to the ground GND. In the case where the current $I_{DN}$ flows through the N-channel MOS transistor $Q_N$ when the output terminal 2 is at a low level, a noise voltage $V_S$ occurs on both ends of the series parasitic inductance L. Then, the noise voltage $V_S$ becomes a ground noise on the ground line 21, leading to the possibility of giving bad influences to circuit operations and functions. The noise voltage $V_S$ occurs due to a voltage drop in the series parasitic inductance L. Accordingly, the noise voltage $V_S$ is represented by the following Equation (8) and becomes larger as the rate of change of the current $I_{DN}$ increases.

$$V_S = L \cdot \frac{d \cdot I_{DN}}{dt} \quad (8)$$

Moreover, using a load capacity $C_L$ connected to the output terminal 2 of the buffer circuit, the following approximate Equation (=approximate expression) (9) is obtained.

$$\Delta t = C_L \cdot \frac{V_{DD}}{I_{DN}} \quad (9)$$

Furthermore, assuming that the current $I_{DN}$ is uniform, Equation (8) can be transformed into the following Equation (10):

$$V_S = L \cdot \frac{\Delta I_{DN}}{\Delta t} = \frac{L \cdot I_{DN}^2}{C_L \cdot V_{DD}} \quad (10)$$

If Equation (2) is substituted in Equation (10), the noise voltage $V_S$ may be expressed by the following Equation (11):

$$V_S = \frac{(V_I - V_{TN})^4}{4 V_{DD}} \cdot \frac{L \cdot \beta_N^2}{C} \quad (11)$$

Here, the source voltage $V_{DD}$ and the input voltage $V_I$ are both 5 V, and the threshold voltage $V_{TN}$ changes into 1.0 V from 0.8 V, and $\beta_N$ changes into $0.8 \cdot \beta_{N0}$ due to the deterioration of the drive ability caused by the unevenness of the elements. In this case, the noise voltage VS1 may be expressed by the following Equation (12).

$$V_{S1} = \frac{8.19 L \cdot \beta_{N0}^2}{C_L} \quad (12)$$

Alternatively, when the threshold voltage $V_{TN}$ becomes 0.6 V and $\beta_N$ becomes $1.2 \cdot \beta_{N0}$ due to the increase in the drive ability caused by the unevenness of the elements, the noise voltage $V_{S2}$ may be expressed by the following Equation (13).

$$V_{S2} = \frac{27.0 L \cdot \beta_{N0}^2}{C_L} \quad (13)$$

Accordingly, the noise voltage $V_{S2}$, which is obtained when the drive ability of the buffer circuit is increased, equals 3.3 times the noise voltage $V_{S1}$ obtained when the drive ability is decreased, as shown in the following Equation (14).

$$\frac{V_{S2}}{V_{S1}} = 3.3 \quad (14)$$

As a result, in the case where the buffer circuit is used as the output buffer of the semiconductor integrated circuit, the three times noise or more occurs when the drive ability becomes maximum. This may result in the possibility that the semiconductor integrated circuit does not operate correctly.

The above descriptions concern the ground noise occurring on the ground line 21. Similarly, a source noise occurs on an electric line connected to the power source $V_{DD}$ in the semiconductor integrated circuit, and causes the operational error of the circuit.

FIGS. 21 and 22 show a structure of the conventional buffer circuit which has been proposed in order to reduce such a noise in the case where the buffer circuit is used as the output buffer.

In the conventional buffer circuit, as shown in FIG. 21 (see Japanese Laid-Open Patent Publication No. 58-196725), by selectively adjusting the channel widths and channel lengths of the MOS P-channel transistor and the N-channel MOS transistor, these transistors do not simultaneously become ON. Moreover, while the output level is switched, a current flowing through the power source $V_{DD}$ to the ground GND is reduced, thereby restraining the occurrence of the source noise.

Furthermore, in the conventional buffer circuit as shown in FIG. 22 (see Japanese Laid-Open Patent Publication No. 58-196726), an output transistor is divided into some parts and the divided output transistors operate separately so as to prolong a rise time of the current and restrain the change rate thereof. As a result, the occurrence of a large power-source noise can be prevented.

However, in such conventional buffer circuits as shown in FIGS. 21 and 22, the margin of the circuit characteristics is set to be large enough so that the power-source noise is prevented from occurring, even if the characteristics of the elements are varied. As a result, the desired circuit characteristics cannot always be obtained, depending on the variation of the characteristics of the elements. Furthermore, when the conventional buffer circuit is used as the input buffer, the noise margin cannot be sufficiently obtained.

Japanese Laid-Open Patent Publication No. 64-57491 discloses a semiconductor integrated circuit in which delay characteristics of a timing setting circuit can be adjusted by a fuse means. In this reference, the number of delay circuits connected in series is adjusted by the fuse means. However, the characteristics of the buffer circuit cannot be adjusted directly.

SUMMARY OF THE INVENTION

A buffer circuit according to the present invention includes an input terminal for inputting an input signal, an inversion means for inverting the input signal and outputting the inverted input signal to an output terminal, wherein the inversion means has a plurality of PMOS transistors and a plurality of NMOS transistors; each of the plurality of PMOS transistors has a source connected to a power source, a drain connected to the output terminal, and a gate connected to the input terminal; each of the plurality of NMOS transistors has a source connected to a ground, a drain connected to the output terminal, and a gate connected to the input terminal; and the gate of at least one of the plurality of PMOS transistors and NMOS transistors is connected to the input terminal via a fuse means which can be selectively disconnected (cut).

In one embodiment of the invention, the source of at least one of the plurality of PMOS transistors is connected to a terminal of the power source via a pull-up means; and the source of at least one of the plurality of NMOS transistors is connected to a terminal of the ground via a pull-down means.

In another embodiment of the invention, the pull-up means and the pull-down means respectively include a resistor made of a high-resistance polysilicon.

Alternatively, a buffer circuit according to the present invention includes an input terminal for inputting an input signal, an inversion means for inverting the input signal and outputting the inverted input signal to an output terminal, wherein the inversion means has a plurality of PMOS transistors and a plurality of NMOS transistors; each of the plurality of PMOS transistors has a source connected to a power source, a drain connected to the output terminal, and a gate connected to the input terminal; each of the plurality of NMOS transistor has a source connected to a ground, a drain connected to the output terminal, and a gate connected to the input terminal; and the drain of at least one of the plurality of PMOS transistors and the plurality of NMOS transistors is connected to the output terminal via a fuse means which can be selectively disconnected.

Alternatively, a buffer circuit according to the present invention includes an input terminal for inputting an input signal, a first inversion means for inverting the input signal and outputting the inverted input signal to a first output terminal, a second inversion means for further inverting the inverted input signal outputted from the first output terminal and outputting the further inverted signal to a second output terminal for outputting the output signal, wherein the first inversion means and the second inversion means respectively have a plurality of PMOS transistors and a plurality of NMOS transistors; each of the plurality of PMOS transistors of the first inversion means has a source connected to a power source, a drain connected to the first output terminal, and a gate connected to the input terminal; each of the plurality of NMOS transistors of the first inversion means has a source connected to a ground, a drain connected to the first output terminal, and a gate connected to the input terminal; the drain of at least one of the plurality of PMOS transistors and the plurality of NMOS transistors of the first inversion means is connected to the first output terminal via a fuse means which can be selectively disconnected; each of the plurality of PMOS transistors of the second inversion means has a source connected to the power source, a drain connected to the second output terminal, and a gate connected to the first output terminal; each of the plurality of NMOS transistors of the second inversion means has a source connected to the ground, a drain connected to the second output terminal, and a gate connected to the first output terminal; and the drain of at least one of the plurality of PMOS transistors and the plurality of NMOS transistors of the second inversion means is connected to the second output terminal via a fuse means which can be selectively disconnected.

Alternatively, a buffer circuit according to the present invention includes an input terminal for inputting an input signal, a first inversion means for inverting the input signal and outputting the inverted input signal to a first output terminal, a second inversion means for further inverting the inverted input signal outputted from the first output terminal and outputting the further inverted signal to a second output terminal, wherein the first inversion means and the second inversion means respectively have a plurality of PMOS transistors and a plurality of NMOS transistors; each of the plurality of PMOS transistors of the first inversion means has a source connected to a power source, a drain connected to the first output terminal, and a gate connected to the input terminal; each of the plurality of NMOS transistors of the first inversion means has a source connected to a ground, a drain connected to the first output terminal, and a gate connected to the input terminal; each of the plurality of PMOS transistors of the second inversion means has a source connected to the power source, a drain connected to the second output terminal, and a gate connected to the first output terminal; each of the plurality of NMOS transistors of the second inversion means has a source connected to a ground, a drain connected to the second output terminal, and a gate connected to the first output terminal; the source of at least one of the plurality of PMOS transistors of the first and second inversion means is connected to the power source via a fuse means which can be selectively disconnected; and the source of at least one of the plurality of NMOS transistors of the first and the second inversion means is connected to the ground via the fuse means which can be selectively disconnected.

Alternatively, a buffer circuit according to the present invention includes an input terminal for inputting an input signal, an inversion means for inverting the input signal and outputting the inverted input signal to an output terminal, wherein the inversion means has a plurality of PMOS transistors and a plurality of NMOS transistors; each of the plurality of PMOS transistors has a source connected to a power source, a drain connected to the output terminal, and a gate connected to the input terminal; each of the plurality of NMOS transistors has a source connected to a ground, a drain connected to the output terminal, a gate connected to the input terminal; the source of at least one of the plurality of PMOS transistors is connected to the power source via a fuse means which can be selectively disconnected; and the source of at least one of the plurality of NMOS transistors is connected to the ground via a fuse means which can be selectively disconnected.

Alternatively, a buffer circuit according to the present invention includes a first input terminal for inputting a first input signal, an inversion means for inverting the first input signal and outputting the inverted first input signal to an output terminal and output control means for controlling the output of the inverted first input signal in response to a second input signal, wherein the inversion means includes a plurality of PMOS transistors and a plurality of NMOS transistors; each of the plurality of PMOS transistors has a source connected to a power source, a drain connected to the output control means, and a gate connected to the first input terminal; each of the plurality of NMOS transistors has a source connected to a ground, a drain connected to the output control means, and a gate connected to the first input terminal; the drain of at least one of the plurality of PMOS transistors is connected to a drain of another one of the plurality of PMOS transistors via a fuse means which can be selectively disconnected; and the drain of at least one of the plurality of NMOS transistors is connected to a drain of another one of the plurality of NMOS transistors via a fuse means which can be selectively disconnected.

Alternatively, a buffer circuit according to the present invention includes a first input terminal for inputting a first input signal, an inversion means for inverting the first input signal and outputting the inverted first input signal to an output terminal, and an output control means for controlling the output of the inverted first input signal in response to a second input signal, wherein the inversion means includes a plurality of PMOS transistors and a plurality of NMOS transistors; the plurality of PMOS transistors are connected in series between a terminal of a power source and the output control means, and respective gates of the plurality of PMOS transistors are connected to the first input terminal; the plurality of NMOS transistors are connected in series between a terminal of the ground and the output control means, and respective gates of the plurality of NMOS transistors are connected to the first input terminal; the drain of at least one of the plurality of PMOS transistors is connected to the terminal of the power source via a fuse means which can be selectively disconnected; and the drain of at least one of the plurality of NMOS transistors is connected to the terminal of the ground via the fuse means which can be selectively disconnected.

In one embodiment of the invention, a buffer circuit further includes a second inversion circuit including a plurality of PMOS transistors and a plurality of NMOS transistors, wherein each of the plurality of PMOS transistors of the second inversion circuit has a source connected to a power source, a drain connected to the output control means, and a gate connected to the first input terminal; each of the plurality of NMOS transistors of the second inversion circuit has a source connected to a ground, a drain connected to the output control means, and a gate connected to the first input terminal; the drain of at least one of the plurality of PMOS transistors of the second inversion circuit is connected to a drain of another one of the plurality of PMOS transistors of the second inversion circuit via a fuse means which can be selectively disconnected; and the drain of at least one of the plurality of NMOS transistors of the second inversion circuit is connected to a drain of another one of the plurality of NMOS transistors of the second inversion circuit via the fuse means which can be selectively disconnected.

In the buffer circuit according to the present invention, all of PMOS transistors of an inversion circuit are connected in parallel between a power source and an output terminal, while all of the fuse means are not disconnected (cut). Therefore, all of these PMOS transistors can function together as a P-channel MOS transistor. In this case, a substantial channel width of the total P-channel MOS transistor equals the sum of each channel width of all the PMOS transistors. Accordingly, when the PMOS transistors are partially separated from the inversion circuit by selectively disconnecting (cutting) the fuse means, the substantial channel width of the total P-channel MOS transistor is varied to the sum of each channel width of the residual PMOS transistors.

Furthermore, while all of the fuse means of the inversion circuit are not disconnected, all of NMOS transistors of the inversion circuit are connected in parallel between a ground and an output terminal. Therefore, all of these NMOS transistors can function together as an N-channel MOS transistor. In this case, a substantial channel width of the total N-channel MOS transistor equals the sum of each channel width of all the NMOS transistors. Accordingly, when the NMOS transistors are partially separated from the inversion circuit by selectively disconnecting the fuse means, the substantial channel width of the total N-channel MOS transistor is varied to the sum of each channel width of the residual NMOS transistors.

Then, the above total P-channel MOS transistor and N-channel MOS transistor form an inverter.

As a result, in the case where the circuit characteristics, measured after fabricating each MOS transistor of the buffer circuit, are not excellent, the channel widths of the total P-channel MOS transistor and the total N-channel MOS transistor can be varied by selectively disconnecting the fuse means. Thus, the drive ability of the total MOS transistor can be adjusted, or the input inversion voltage as the inverter of these MOS transistors can be adjusted, whereby the circuit characteristics can be varied to obtain a desired value.

According to another buffer circuit of the present invention, all of the PMOS transistors in the inversion circuit can be connected in series between the power source and the output terminal, while the fuse means are all disconnected. As a result, all of these PMOS transistors can function together as the P-channel MOS transistor. In this case, a substantial channel length of the total N-channel MOS transistor equals the sum of each transistor length of all the PMOS transistors. Accordingly, when the PMOS transistors are separated from a series circuit by selectively disconnecting the fuse means or avoiding the disconnection, the substantial channel length of the total P-channel MOS transistor is varied to the sum of each channel length of the residual PMOS transistors.

Furthermore, while the fuse means of the inversion circuit are all disconnected, all of the NMOS transistors can be connected in series between the ground and the output terminal. Therefore, all of these NMOS transistors can function together as the N-channel MOS transistor. In this case, the substantial channel length of the total N-channel MOS transistor equals the sum of each transistor length of all the NMOS transistors. Accordingly, when the NMOS transistor is separated from the series circuit by selectively disconnecting the fuse means or avoiding the disconnection, the substantial channel length of the total N-channel MOS transistor is varied to the sum of each channel length of the residual NMOS transistors.

Then, the above total P-channel MOS transistor and N-channel MOS transistor form an inverter.

As a result, in the case where the circuit characteristics, measured after fabricating each MOS transistor of the buffer circuit, are not excellent, the channel lengths of the total P-channel MOS transistor and the total N-channel MOS transistor can be varied by selectively disconnecting the fuse means of the series PMOS selection circuit and the series NMOS selection circuit or avoiding the disconnection. Thus, the drive ability of the total MOS transistor can be adjusted, or the input inversion voltage as the inverter of these MOS transistors can be adjusted, whereby the circuit characteristics can be varied to obtain a desired value.

The adjustable PMOS and the adjustable NMOS connected in series can be disconnected from the series circuit by short-circuiting between the source and the drain.

Thus, the invention described herein makes possible the advantage of disconnecting (cutting) part of the transistor by cutting the fuse, thereby setting optimum circuit characteristics.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

Example 1

Figure 1:
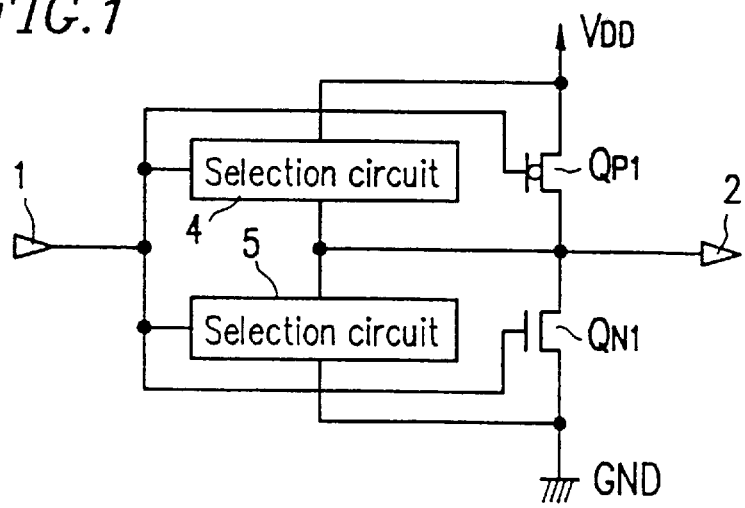
FIG. 1 is a schematic diagram of a first example of the present invention.
Figure 2:
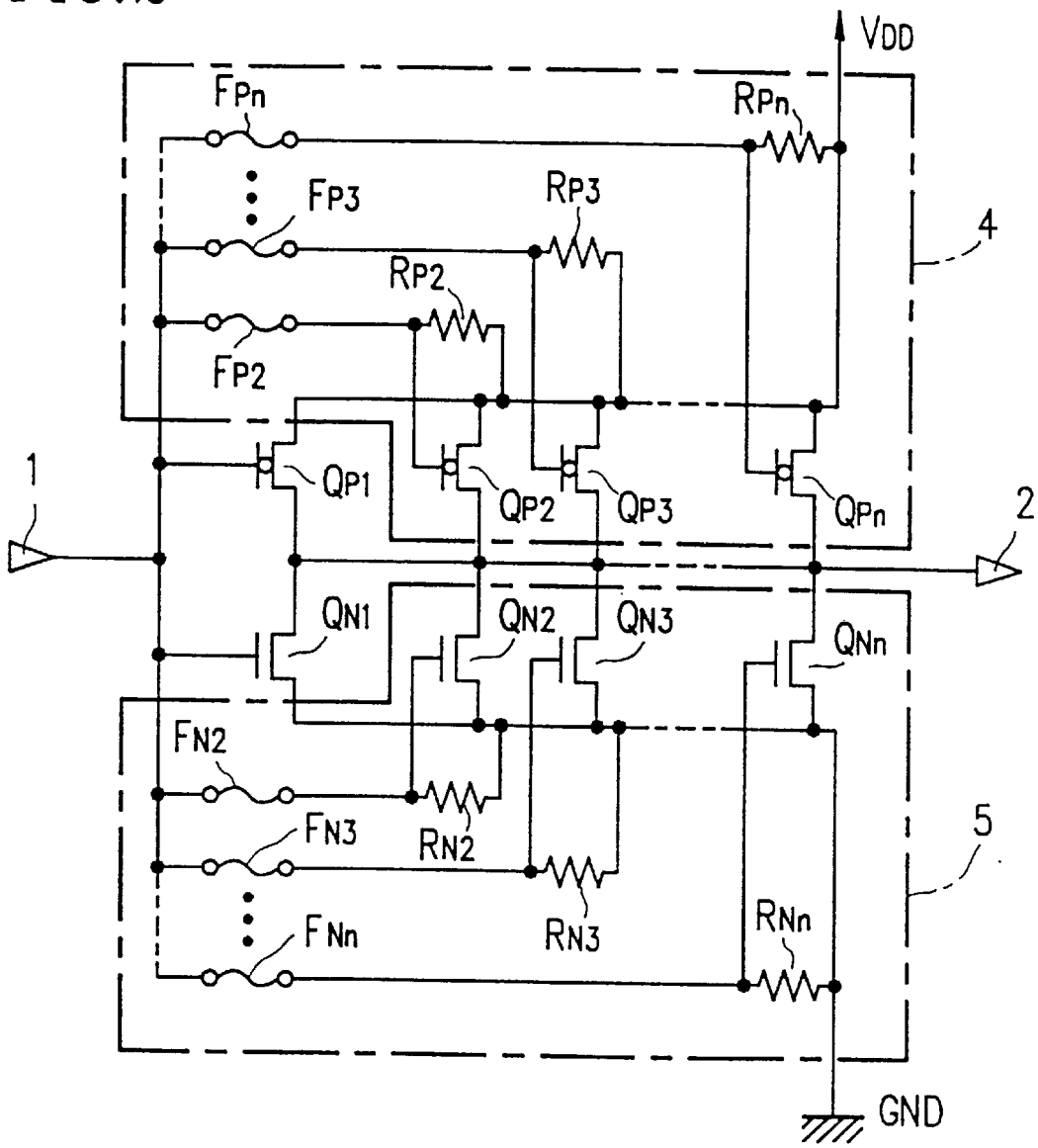
FIG. 2 is a diagram of a first example of the present invention.
Figure 18:
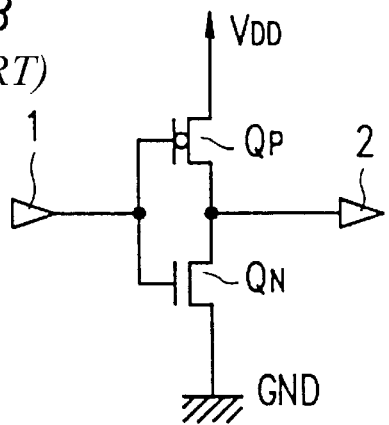
FIG. 18 is a diagram of a conventional buffer circuit.
Figure 19:
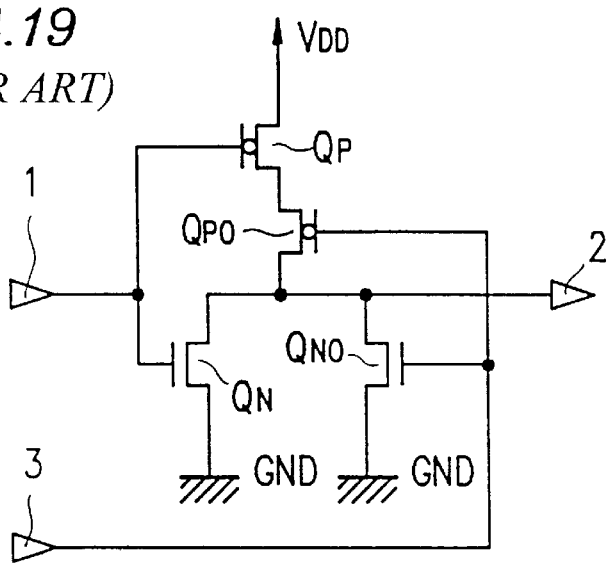
FIG. 19 is a diagram of another conventional buffer circuit.
Figure 20:
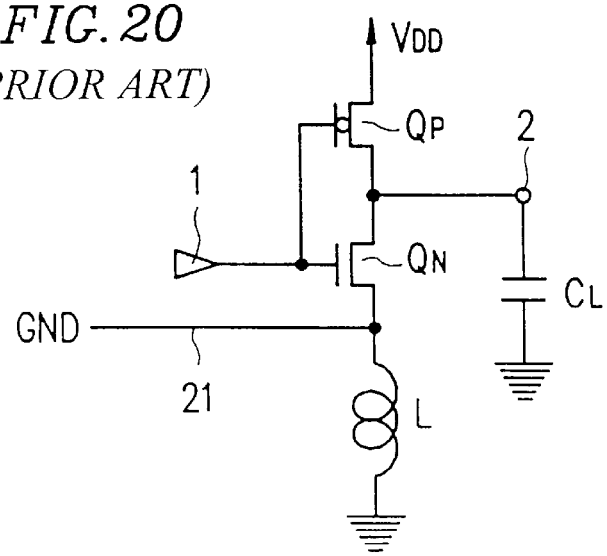
FIG. 20 is an equivalent circuit diagram for explaining noise which occurs in a buffer circuit.
Figure 21:
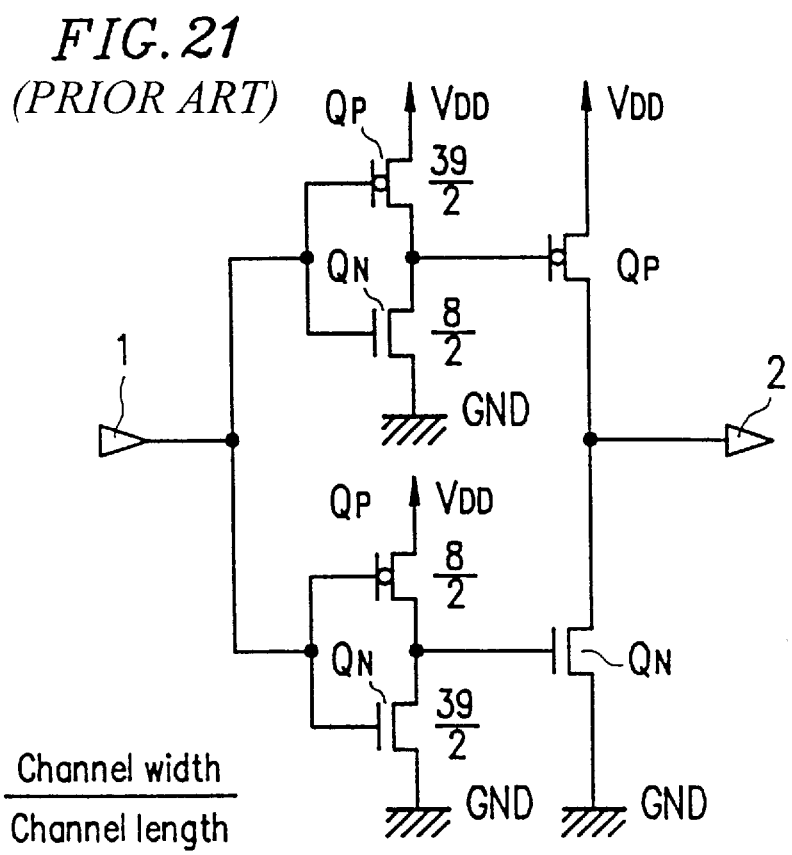
FIG. 21 is a diagram of a conventional buffer circuit to which a noise treatment is applied.
Figure 22:
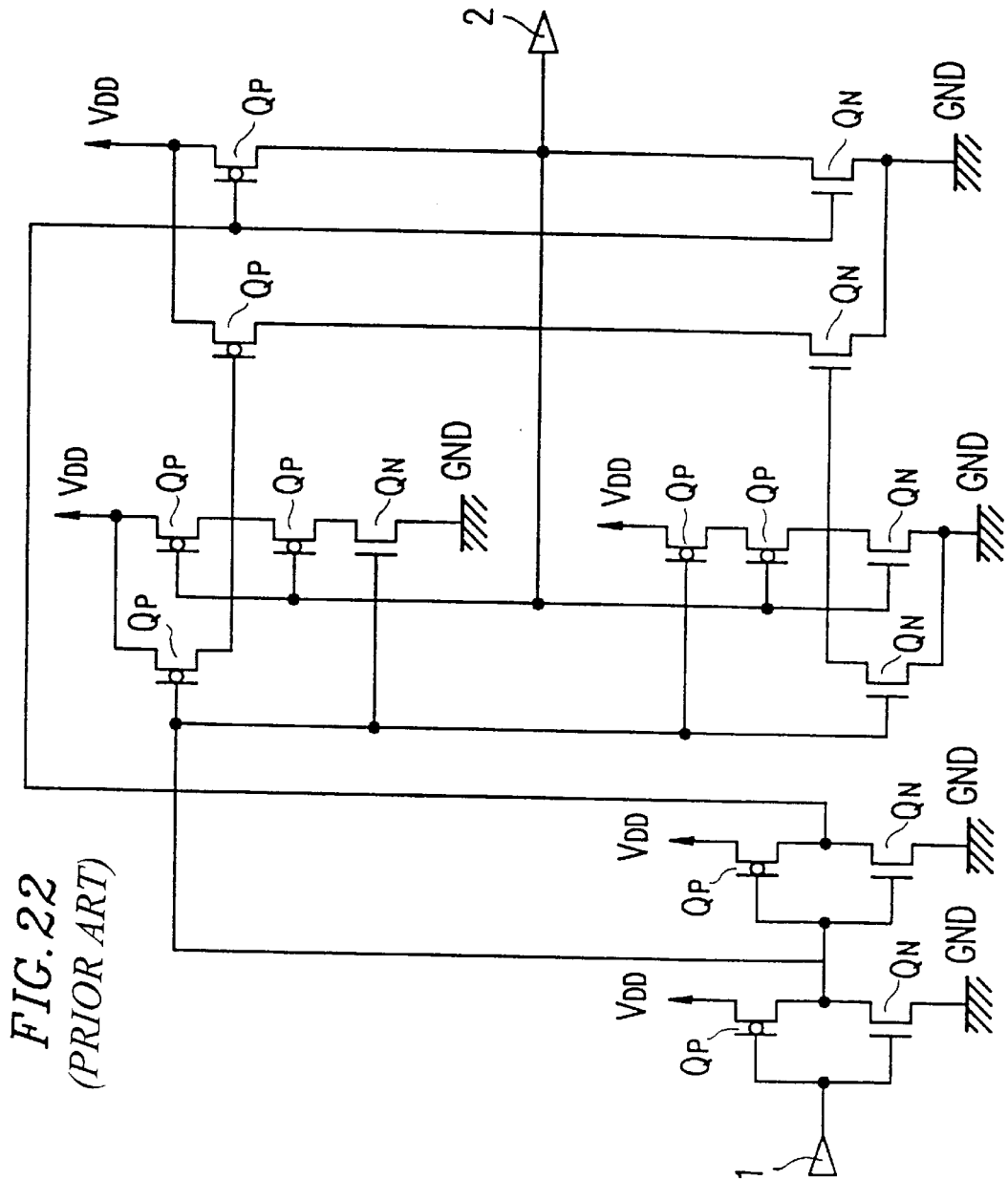
FIG. 22 is a diagram of a conventional buffer circuit to which another noise treatment is applied.

FIG. 1 is a schematic diagram of a buffer circuit and FIG. 2 is a diagram of the buffer circuit, which show a first example of the present invention. The same reference numerals will be attached to structural members of these figures, which have the same functions as those of the conventional example in FIG. 18.

The buffer circuit of this example includes a PMOS selection circuit 4 and an NMOS selection circuit 5, in which the fuse means is connected to the gate of each of the PMOS transistors and each of the NMOS transistors.

The buffer circuit, as shown in FIG. 1, includes a set of a complementary P-channel MOS transistor $Q_{P1}$ (a main PMOS) and N-channel MOS transistor $Q_{N1}$ (a main NMOS); a PMOS selection circuit 4; and an NMOS selection circuit 5. The P-channel MOS transistor $Q_{P1}$ has a source connected to a power source $V_{DD}$, a drain connected to an output terminal 2 of the buffer circuit, and a gate connected to an input terminal 1 of the buffer circuit. The N-channel MOS transistor $Q_{N1}$ has a source connected to a ground GND, a drain connected to the output terminal 2, and a gate connected to the input terminal 1. The PMOS selection circuit 4 is connected between the input terminal 1 and the output terminal 2 in parallel with the P-channel MOS transistor $Q_{P1}$. The NMOS selection circuit 5 is connected between the input terminal 1 and the output terminal 2 in parallel with the N-channel MOS transistor $Q_{N1}$.

The PMOS selection circuit 4, as shown in FIG. 2, includes n−1 pieces of P-channel MOS transistors $Q_{P2}$ to $Q_{Pn}$ (i.e., the adjustable PMOSs). Respective sources of these P-channel MOS transistors $Q_{P2}$ to $Q_{Pn}$ are connected in common to the source of the P-channel MOS transistor $Q_{P1}$; respective drains thereof are connected in common to the drain of the P-channel MOS transistor $Q_{P1}$; and respective gates thereof are connected in common to the gate of the P-channel MOS transistor $Q_{P1}$ via fuses (fuse means) $F_{P2}$ to $F_{Pn}$ Moreover, these gates are connected to the source of the P-channel MOS transistor $Q_{P1}$ via pull-up resistors (pull-up means) $R_{P2}$ to $R_{Pn}$, respectively, and ultimately to the power source $V_{DD}$.

The NMOS selection circuit 5 includes n−1 pieces of N-channel MOS transistors $Q_{N2}$ to $Q_{Nn}$ (i.e., adjustable NMOSs). Respective sources of these transistors $Q_{N2}$ to $Q_{Nn}$ are connected in common to the source of the N-channel MOS transistor $Q_{N1}$; respective drains thereof are connected in common to the drain of the N-channel MOS transistor $Q_{N1}$; and respective gates thereof are connected in common to the gate of the N-channel MOS transistor $Q_{N1}$ via fuses (fuse means) $F_{N2}$ to $F_{Nn}$. Moreover, these gates are connected to the source of the N-channel MOS transistor $Q_{N1}$ via the pull-down resistors (pull-down means) $R_{N2}$ to $R_{Nn}$, respectively, and ultimately to the ground GND.

The above fuses $F_{P2}$ to $F_{Pn}$ and $F_{N2}$ to $F_{Nn}$ are wire portions formed on the tip surfaces which can be disconnected (cut). These fuses are selected in the final step of the fabrication processes and disconnected by a laser trimming and the like. The pull-up resistors $Rp_2$ to $R_{Pn}$ and pull-down resistors $R_{N2}$ to $R_{Nn}$ are made of a high-resistance polysilicon (polycrystalline silicon). The input terminal 1 is connected to the power source $V_{DD}$ via the pull-up resistors $R_{P2}$ to $R_{Pn}$, and connected to the ground GND via the pull-down resistor $R_{N2}$ to $R_{Nn}$. Deterioration of an input impedance can be substantially prevented by use of such a highly resistant polysilicon. In addition, in an SRAM and the like, a high-resistance polysilicon may be used for a load of a memory cell. When the buffer circuit of this example is used for such an SRAM, the pull-up resistors $R_{P2}$ to $R_{Pn}$ and the pull-down resistors $R_{N2}$ to $R_{Nn}$ can be made of the same polysilicon at the same time.

In the above buffer circuit, all of the P-channel MOS transistors $Q_{P1}$ to $Q_{Pn}$ and all of the N-channel transistors $Q_{N1}$ to $Q_{Nn}$ are respectively integrated and function as an inverter. Accordingly, when a higher voltage than the input inversion voltage $V_{INV}$ is applied to the input terminal 1, the P-channel MOS transistors $Q_{P1}$ to $Q_{Pn}$ become OFF and the output terminal 2 is insulated from the power source $V_{DD}$. Simultaneously, the N-channel MOS transistors $Q_{N1}$ to $Q_{Nn}$ become ON and the voltage of the output terminal 2 falls to the ground GND voltage, whereby the output terminal 2 outputs a low level voltage. Alternatively, when a lower voltage than the input voltage $V_{INV}$ is applied to the input terminal 1, the P-channel MOS transistors $Q_{P1}$ to $Q_{Pn}$ become ON and the voltage of the terminal 2 becomes the same voltage as the power source $V_{DD}$. Simultaneously, the N-channel MOS transistors $Q_{N1}$ to $Q_{Nn}$ become OFF and are insulated from the ground GND, whereby the output terminal 2 outputs a high level voltage.

In the case where the buffer circuit is used as the input buffer under the following conditions: the power source $V_{DD}$ of 5 V, the threshold voltages $V_{TN}$ and $V_{PN}$ of 0.8 V and −0.8 V which are standard process constants of the fabrication processes, the gain constant ratio $\beta_N/\beta_P$ (the ratio of the gain constant of the total N-channel MOS transistors $Q_{N1}$ to $Q_{Nn}$ to the gain constant of the total P-channel MOS transistors $Q_{P1}$ to $Q_{Pn}$) may be 14.9 from Equation (3), in order to obtain an optimum value of 1.5 V for the input inversion voltage $V_{INV}$. Since the P-channel MOS transistors $Q_{P1}$ to $Q_{Pn}$ and the N-channel MOS transistors $Q_{N1}$ to $Q_{Nn}$ are respectively connected in parallel, a substantial channel width of the P-channel MOS transistors and the N-channel MOS transistors is respectively a sum of channel widths of each MOS transistor. If a substantial channel length is uniform, the gain constants ($\beta_N$ and $\beta_P$) are determined by the sum of the gain constants of the MOS transistors ($Q_{N1}$ to $Q_{Nn}$ and $Q_{P1}$ to $Q_{Pn}$) from Equations (4) and (5), respectively. Accordingly, the gain constants $\beta_N$ and $\beta_P$ whose ratio $\beta_N/\beta_P$ equals 14.9 are assigned to each of the P-channel MOS transistors $Q_{P1}$ to $Q_{Pn}$ and the N-channel MOS transistors $Q_{N1}$ to $Q_{Nn}$, and then the channel width $W_P$ and the channel length $L_P$ of respective P-channel transistors and the channel width $W_N$ and the channel length $L_N$ of respective N-channel transistors are set from Equations (4) and (5) in the fabrication of the buffer circuit.

In the case of fabricating a semiconductor integrated circuit by setting the input buffer in the above manner, transistor characteristics of a TEG (Test Element Group) on a wafer are examined in a final test step of the wafer processes for checking if they are preferable or not. When the characteristics are not preferable, because the process constants are changed due to unevenness of the fabrication processes, the gain constant ratio $\beta N/\beta_P$, which is required for obtaining the optimum input inversion voltage $V_{INV}$ of 1.5 V, is recalculated with the process constants obtained by the measurement of the transistor characteristics based on Equation (3). Then, the fuses $F_{P2}$ to $F_{Pn}$ and $F_{N2}$ to $F_{Nn}$ are selectively disconnected based on the recalculated gain constant ratio $\beta_N/\beta_P$.

For example, in the case where the threshold voltages $V_{TN}$ and $V_{PN}$ of the process constants are 0.6 V and −1.0 V, respectively, after measuring the transistor characteristics of the TEG, the input inversion voltage $V_{INV}$ becomes 1.3 V from Equation (3) and a noise margin on the low-level side is reduced to 0.5 V, because the gain constant ratio $\beta_N/\beta_P$ is 14.9. Alternatively, the value of the gain constant ratio $\beta_N/\beta_P$ becomes 7.71 when it is recalculated from Equation (3) for obtaining the optimum input inversion voltage $V_{INV}$ of 1.5 V. Furthermore, when assuming that the transistors have the same channel widths $W_P$ and $W_N$ and the same channel lengths $L_P$ and $L_N$, the gain constant $\beta_N$ of the total N-channel MOS transistors $Q_{N1}$ to $Q_{Nn}$ becomes n−m/n times the gain constant $\beta_N$ by disconnecting (cutting) m of n−1 pieces of fuses FN2 to FNn. In this case, when assuming that each input buffer circuit includes ten MOS transistors, and five of the fuses $F_2$ to $F_{Nn}$ are disconnected, the gain constant $\beta_N$ is reduced by one half and the gain constant ratio $\beta_N/\beta_P$ is varied from 14.9 to 7.45 (i.e., 14.9/2). The value 7.45 of the gain constant ratio $\beta_N/\beta_P$ is close to the above calculated value of 7.71. Thus, when the gain constant ratio $\beta_N/\beta_P$ of 7.45 is substituted in Equation (3), the input inversion voltage $V_{INV}$ becomes 1.51 V, which almost coincides with the desired value of 1.5 V. As a result, when the buffer circuit is used as the input buffer, the input inversion voltage $V_{INV}$ will almost have the desired value by disconnecting five of the fuses $F_{N2}$ to $F_{Nn}$.

Furthermore, in the case where the buffer circuit of this example is used as an output buffer, the channel widths $W_P$ and $W_N$ and the channel lengths $L_P$ and $L_N$ of the MOS transistors should be set so as to obtain a drive ability at least for driving the MOS transistors, even though maximum unevenness owing to the fabrication processes degrades the drive ability. When the unevenness of respective element improves the drive ability too much, an excessive current rapidly flows through the MOS transistors while the output level is switched, resulting in an occurrence of a large noise. For example, when the voltage of the input terminal 1 is varied from a low level to a high level, the N-channel MOS transistors $Q_{N1}$ to $Q_{Nn}$ become ON and the voltage of the output terminal 2 is varied to a low level. In this case, if the unevenness improves the drive ability too much, a large current $I_{DN}$ may flow from the load side into the N-channel MOS transistors $Q_{N1}$ to $Q_{Nn}$ via the output terminal 2.

Moreover, the change rate of the current $I_{DN}$ becomes larger, so that a noise voltage $V_S$ as shown in Equations (8) and (10) also becomes larger.

In the case of fabricating the semiconductor integrated circuit including such an output buffer, the transistor characteristics of the TEG on the wafer are examined in the final test step of the wafer processes for checking if they are preferable or not. If the characteristics of the transistors deviate from the predetermined level, and the total device ability of the circuit becomes too high, the fuses $F_{P2}$ to $F_{Pn}$ and $F_{N2}$ to $F_{Nn}$ are selectively disconnected so as to reduce the total drive ability of the circuit. As a result, the rise time or the fall time of the transistor is prolonged, and the change rate of the current is lowered, thereby reducing noise.

For example, in the case where the unevenness of the fabrication processes degrades the drive ability of the N-channel transistors $Q_{N1}$ to $Q_{Nn}$, and the threshold voltage $V_{TN}$ becomes 1.0 V and the gain constant $\beta_N$ becomes equal to $0.8 \cdot \beta_{N0}$, the noise voltage $V_{S1}$ may be expressed by Equation (12). Furthermore, in the case where the unevenness improves the drive ability too much, so that the threshold voltage $V_{TN}$ becomes 0.6 V and the gain constant $\beta_N$ becomes equal to $1.2 \cdot \beta_{N0}$, a noise voltage $V_{S2}$ may be expressed by Equation (13). In this case, the noise voltage $V_{S2}$ becomes 3.3 times the noise voltage $V_{S1}$ as shown in Equation (14).

When assuming that each output buffer circuit includes 10 MOS transistors as the same as the input buffer, the gain constant $\beta_N$ becomes $(10-4)/10$ times (i.e., 0.6 times) the gain constant $\beta_N$ by disconnecting four of the fuses $F_{N2}$ to $F_{Nn}$. When the above-obtained gain constant of $0.6 \cdot \beta_N$ is substituted in Equation (13) in place of the gain constant $\beta_N$, the noise voltage $V_{S3}$ becomes equal to 0.36 times (i.e., the square of 0.6) the noise voltage $V_{S2}$ as shown in the following Equation (15):

$$V_{S3} = \frac{9.72 L \cdot \beta_{N0}^2}{C_L} \quad (15)$$

The noise voltage $V_{S3}$ can be improved to 1.19 times the noise voltage $V_{S1}$ as shown in the following Equation (16):

$$\frac{V_{S3}}{V_{S1}} = 1.19 \quad (16)$$

As a result, when the buffer circuit is used as the output buffer, the occurrence of noise can be reduced almost to the desired value by disconnecting four of the fuses $F_{N2}$ to $F_{Nn}$.

As mentioned above, in the buffer circuit of this example, the desired circuit characteristics can be obtained by selectively disconnecting the fuses $F_{P2}$ to $F_{Pn}$ of the PMOS selection circuit 4 and the fuses $F_{N2}$ to $F_{Nn}$ Of the NMOS selection circuit 5, even though the process constants are changed due to the unevenness of the fabrication processes.

Example 2

Figure 3:
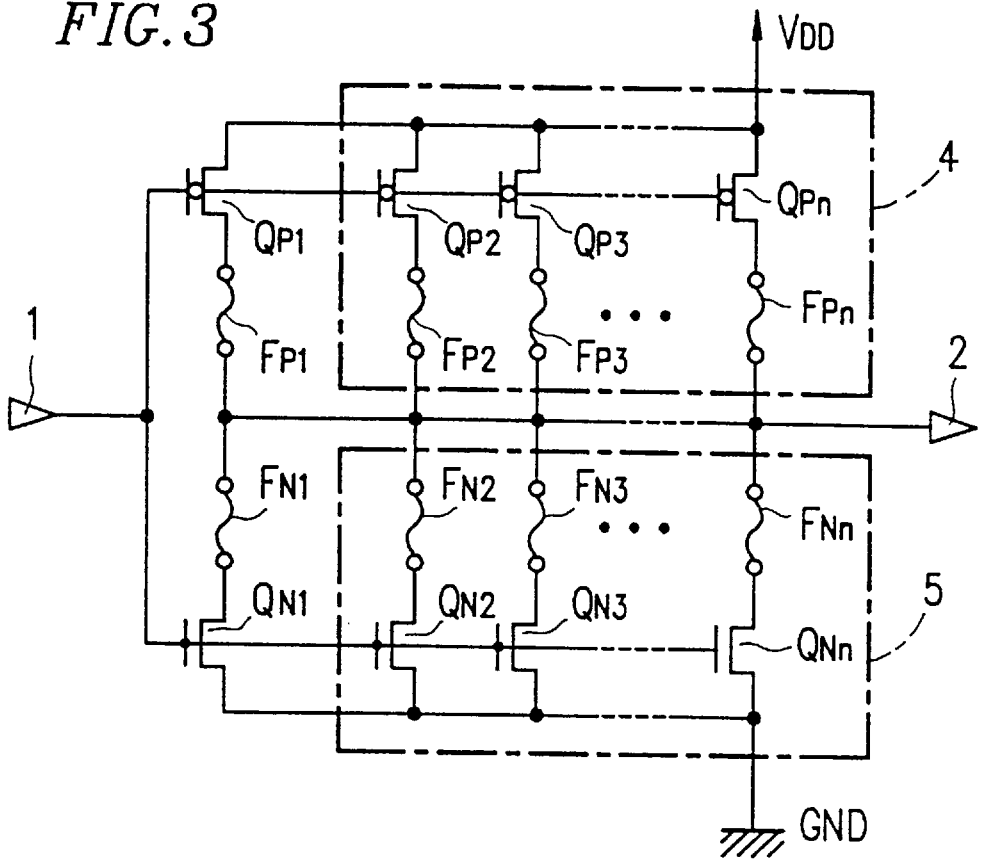
FIG. 3 is a diagram of a second example of the present invention.

FIG. 3 is a diagram showing a buffer circuit in a second example of the present invention. The same reference numerals will be attached to structural members of this figure which have the same functions as those in the first example shown in FIG. 2, and the explanations thereof will be omitted.

The buffer circuit of this example includes the PMOS selection circuit 4 and the NMOS selection circuit 5, in which the fuse means is connected to the drain of each of the PMOS transistors and each of the NMOS transistors.

The buffer circuit of this example includes n sets of complementary P-channel MOS transistors $Q_{P1}$ to $Q_{Pn}$ and N-channel MOS transistors $Q_{N1}$ to $Q_{Nn}$. Respective sources of the n sets of the P-channel MOS transistors $Q_{P1}$ to $Q_{Pn}$ are connected to the power source $V_{DD}$; respective gates thereof are connected in common to the input terminal 1; and respective drains thereof are connected to the output terminal 2 via the fuses (fuse means) $F_{P1}$ to $F_{Pn}$. Respective sources of the n sets of the N-channel MOS transistors $Q_{N1}$ to $Q_{Nn}$ are connected to the ground GND; respective gates thereof are connected in common to the input terminal 1; and respective drains thereof are connected to the output terminal 2 via the fuses (fuse means) $F_{N1}$ to $F_{Nn}$.

In this example, the PMOS selection circuit 4 includes $n-1$ pieces of the P-channel MOS transistors (adjustable transistors) $Q_{P2}$ to $Q_{Nn}$ and the NMOS selection circuit 5 includes $n-1$ pieces of the N-channel MOS transistors (adjustable transistors) $Q_{N2}$ to $Q_{Nn}$. The P-channel MOS transistor $Q_{P1}$ which serves as a main PMOS and the N-channel MOS transistor $Q_{N1}$ which serves as a main NMOS are connected to the fuses $F_{P1}$ and $F_{N1}$, respectively. Accordingly, the main PMOS and the main NMOS are not specially different from the adjustable PMOS and the adjustable NMOS.

Also in this buffer circuit, any MOS transistor can be disconnected (cut) from the circuit by selectively disconnecting (cutting) the fuses $F_{P1}$ to $F_{Pn}$ and $F_{N1}$ to $F_{Nn}$. Accordingly, even though the process constants are changed due to the unevenness of the fabrication processes, the circuit characteristics can be corrected as shown in the first example.

In this example, since all of the MOS transistors can be completely separated from the circuit by disconnecting all of the fuses $F_{P1}$ to $F_{Pn}$ and $F_{N1}$ to $F_{Nn}$, the pull-up resistors (pull-up means) $R_{P2}$ to $R_{Pn}$ and the pull-down resistors (pull-down means) $R_{N2}$ to $R_{Nn}$ are not required.

Example 3

Figure 4:
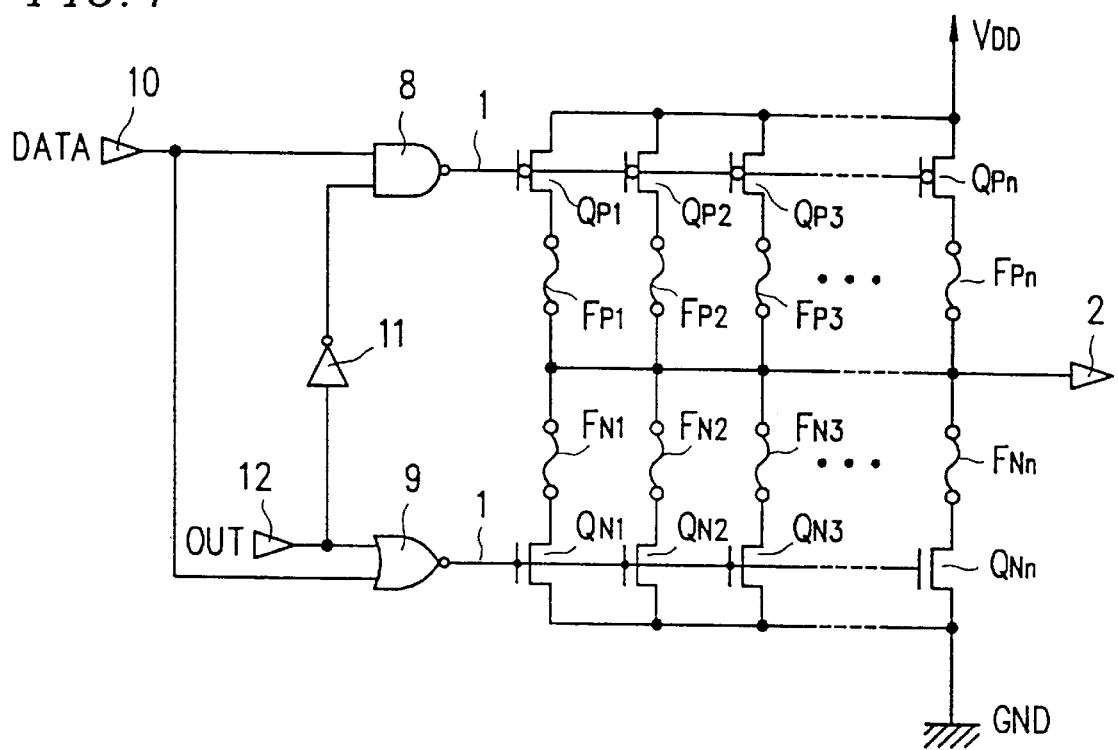
FIG. 4 is a diagram of an output buffer constructed with a buffer circuit of a third example of the present invention.

FIG. 4 is a circuit diagram in a third example of the present invention, in which a buffer circuit is used as an output buffer. The same reference numerals will be attached to structural members of this figure which have the same functions as those in the second example shown in FIG. 3, and the explanations thereof will be omitted.

In this example, the buffer circuit is used as the output buffer of the semiconductor integrated circuit.

The buffer circuit of this example is the same as that of second example, except that the input terminal 1 is divided into two parts: an output of an NAND circuit 8 being connected in common to the gates of the P-channel MOS transistors $Q_{P1}$ to $Q_{Pn}$ and an output of an NOR circuit 9 being connected in common to the gates of the N-channel MOS transistors $Q_{N1}$ to $Q_{Nn}$. One input of the NAND circuit 8 is connected to a data input terminal 10 and the other input thereof is connected to an output permitting terminal 12 via an inverter circuit 11. One input of the NOR circuit 9 is connected to the data input terminal 10 and the other input thereof is directly connected to the output permitting terminal 12.

Accordingly, in the output buffer, when the output permitting terminal 12 is in a low level (active), data which has been input into the data input terminal 10 is output from the output terminal 2 as a non-inversion high level or low level. Alternatively, when the output permitting terminal 12 is in a high level, the output terminal 2 becomes a high impedance state.

When assuming that the data of the data input terminal 10 is switched from a low level to a high level while the output permitting terminal 12 is in a low level, the output of the NAND circuit 8 is varied from a high level to a low level and the P-channel MOS transistors $Q_{P1}$ to $Q_{Pn}$ become ON. As a result, the output terminal 2 is switched from a low level to a high level. When the drive ability of the P-channel MOS transistors $Q_{P1}$ to $Q_{Pn}$ is too high, a large current flows from the power source $V_{DD}$ to the output terminal 2 and the change rate of the current becomes too large, whereby an effect of a source noise cannot be avoided. Alternatively, the data of the data input terminal 10 is switched from a high level to a low level while the output permitting terminal 12 is in a low level, the output of the NOR circuit 9 is varied from a low level to a high level and the N-channel transistors $Q_{N1}$ to $Q_{Nn}$ become ON. As a result, the output terminal 2 is switched from a high level to a low level. When the drive ability of the N-channel MOS transistors $Q_{N1}$ to $Q_{Nn}$ is too high, a large current flows from the load side to the ground GND via the output terminal 2 and the change rate of the current becomes too large, whereby an effect of a ground noise cannot be avoided.

In this example, a change in the voltage level of the output terminal 2 is measured in the TEG on the wafer and compared with data obtained by a circuit simulation, thereby determining which fuses (fuse means) $F_{P1}$ to $F_{Pn}$ and $F_{N1}$ to $P_{Nn}$ should be disconnected (cut). Moreover, the optimum drive ability of the MOS transistors is obtained by selectively disconnecting (cutting) the fuses (fuse means) $Fp_1$ to $F_{Pn}$ and $F_{N1}$ to $F_{Nn}$ before the wafer test, so that the change rate of the current is reduced and the noise can be restrained. For example, when the noise of the power source is too large, the fuses $F_{P1}$ to $F_{Pn}$ connected to the drains of the P-channel MOS transistors $Q_{P1}$ to $Q_{Pn}$ are partially disconnected, and when the ground noise is too large, the fuses $F_{N1}$ to $F_{Nn}$ connected to the drains of the N-channel MOS transistors $Q_{N1}$ to $Q_{Nn}$ are partially disconnected. As a result, the noises of the power source and the ground GND can be reduced.

In this example, the portions of the fuses, which are to be disconnected, can be determined in the same way as shown in the first example.

Example 4

Figure 5:
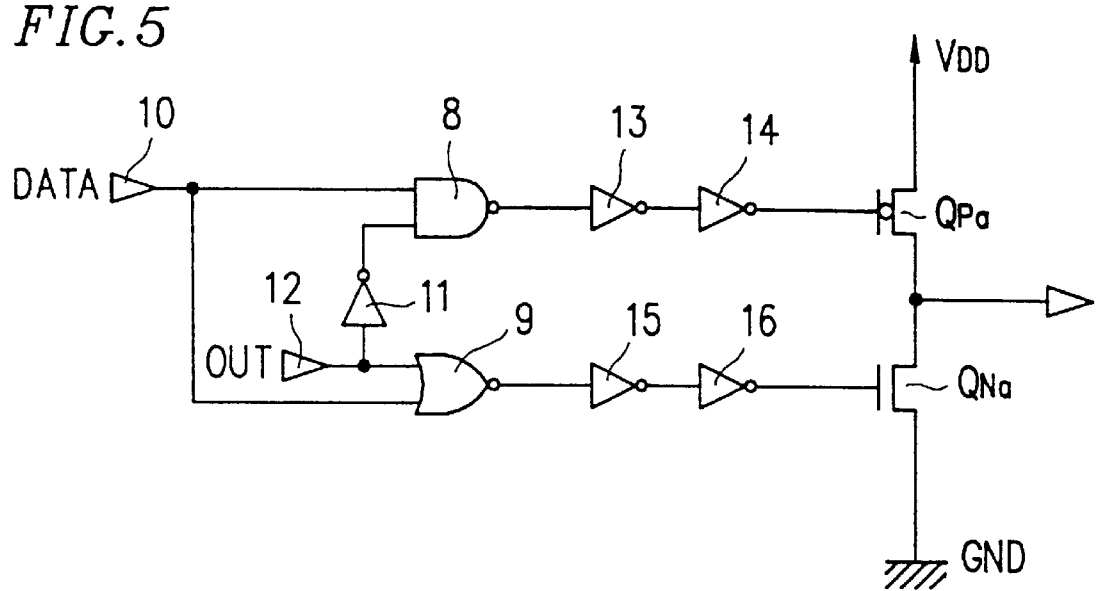
FIG. 5 is a diagram of an output buffer constructed with a buffer circuit of fourth and sixth examples of the present invention.
Figure 6:
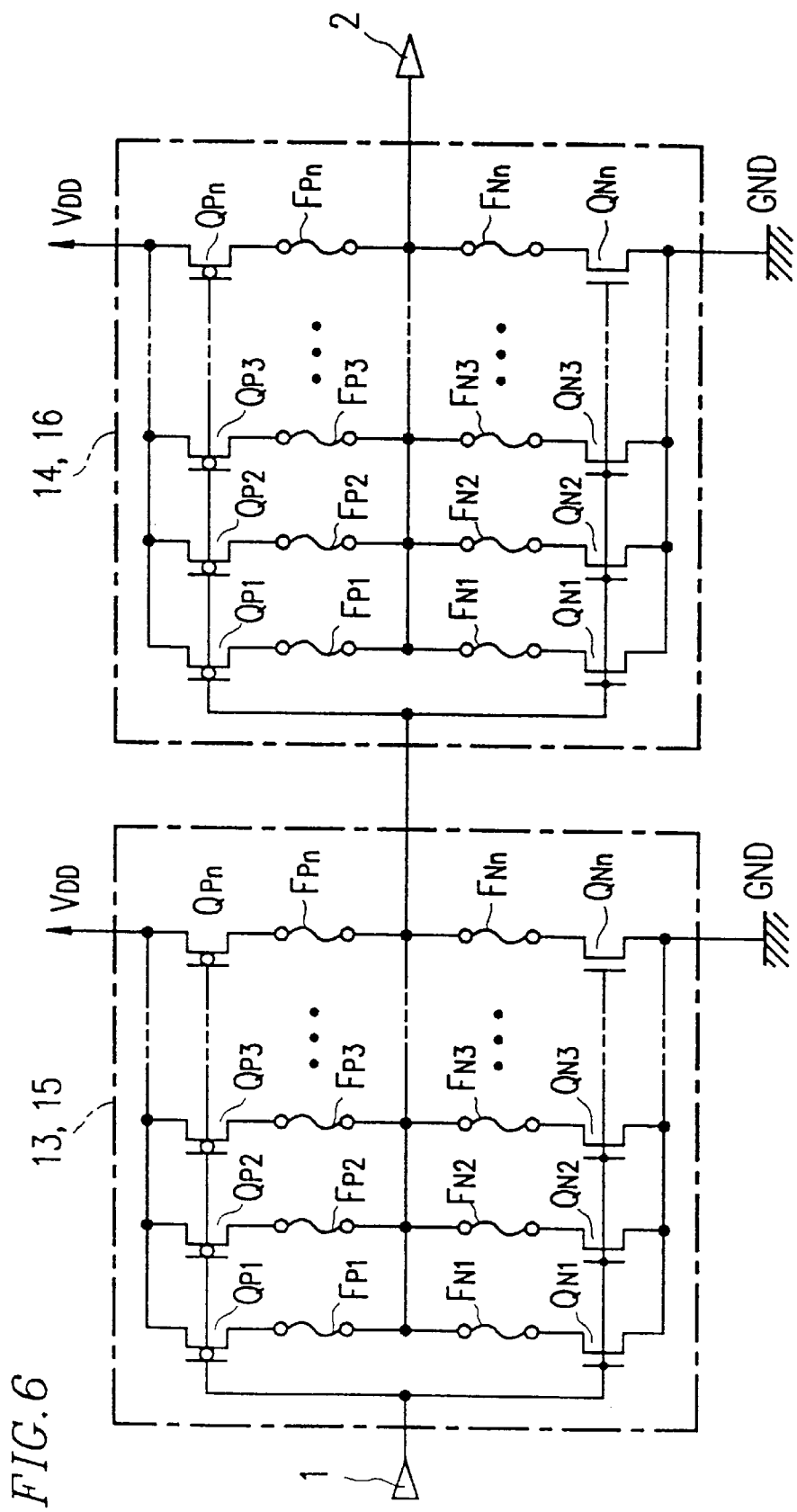
FIG. 6 is a diagram of a buffer circuit of the fourth example of the present invention, the buffer circuit being used as an inverter circuit of an output buffer of FIG. 5.
Figure 7:
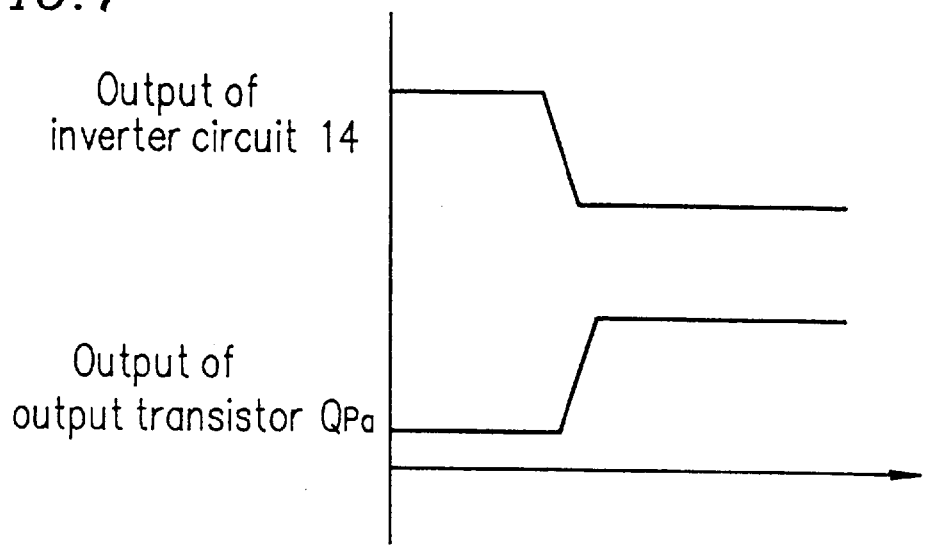
FIG. 7 is a timing diagram of the fourth example of the present invention, which shows an operation of an output buffer before a fuse is disconnected (cut).
Figure 8:
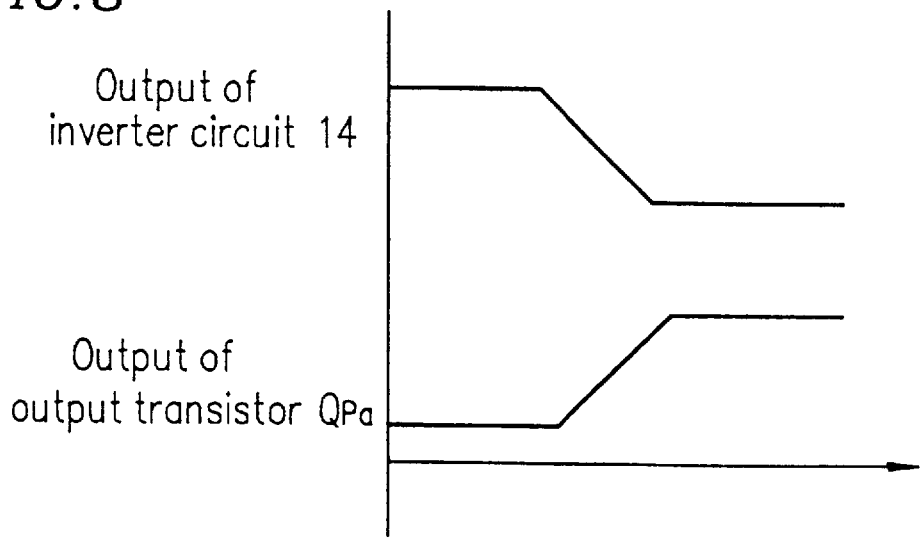
FIG. 8 is a timing diagram of the fourth example of the present invention, which shows an operation of an output buffer after a fuse is disconnected.

FIGS. 5 to 8 show a fourth example of the present invention. FIG. 5 is a circuit diagram in which a buffer circuit is used for an output buffer. FIG. 6 is a diagram of the buffer circuit used for the inverter circuit of the output buffer in FIG. 5. FIG. 7 is a timing diagram showing the operation of the output buffer before the fuses are disconnected. FIG. 8 is a timing diagram showing the operation of the output buffer after the fuses are disconnected. The same reference numerals will be attached to structural members of these figures which have the same functions as those in the second example shown in FIG. 3, and the explanations thereof will be omitted.

In the output buffer shown in FIG. 5, four buffer circuits are used as four inverter circuits 13 to 16. The inverter circuits 13 and 14 also shown in FIG. 6 are connected to a gate of an output transistor $Q_{Pa}$, and the inverter circuits 15 and 16 also shown in FIG. 6 are connected to a gate of an output transistor $Q_{Na}$. As shown in FIG. 6, the buffer circuits each have the same structure as that of the second example shown in FIG. 3. The NAND circuit 8, the NOR circuit 9, the data input terminal 10, the inverter circuit 11, and the output permitting terminal 12, which are provided on the input side of the output buffer circuit, have the same structures as those of the third example shown in FIG. 4.

In the above output buffer circuit, when data of the data input terminal 10 is varied from a low level to a high level while the output permitting terminal 12 is in a low level, the output of the inverter circuit 14 is varied from a high level to a low level, so that the output transistor $Q_{Pa}$ becomes ON. When the drive ability of the inverter circuits 13 and 14 exceeds the required value due to the unevenness of the fabrication processes of the output buffer, an output voltage of the inverter circuit 14 rapidly changes. As a result, the output voltage of the output transistor $Q_{Pa}$ also rapidly changes.

However, when the drive ability of the inverter circuits 13 and 14 is reduced by selectively disconnecting the fuses (fuse means) $F_{P1}$ to $F_{Pn}$ and $F_{N1}$ to $F_{Nn}$, a change in the output voltage of the inverter circuit 14 becomes slow as shown in FIG. 8. As a result, the output voltage of the output transistor $Q_{Pa}$ is gradually raised. Moreover, the output voltage of the output transistor $Q_{Na}$ can be adjusted in the same manner by reducing the drive ability of the inverter circuits 15 and 16.

As mentioned above, by prolonging a delay time of the buffer circuit, the change rate of a current flowing through the output transistors $Q_{Pa}$ and $Q_{Na}$ can be lowered, thereby restraining an occurrence of the noise.

Example 5

Figure 9:
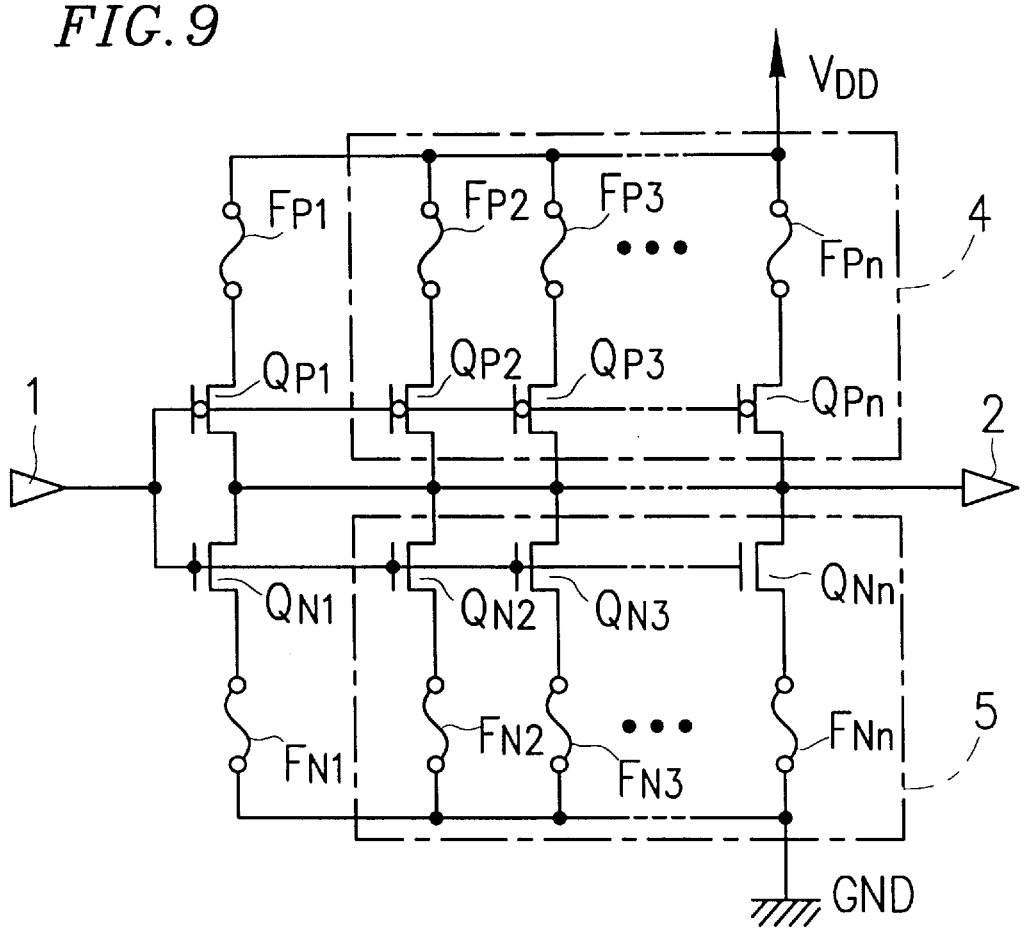
FIG. 9 is a diagram of a buffer circuit of a fifth example of the present invention.

FIG. 9 is a diagram of a buffer circuit in a fifth example of the present invention. The same reference numerals will be attached to structural members of this figure which have the same functions as those in the second example shown in FIG. 3, and the explanations thereof will be omitted.

The buffer circuit of this example includes the PMOS selection circuit 4 and the NMOS selection circuit 5, in which the fuse means is connected to the source of each of the adjustable PMOSs and each of the adjustable NMOSs.

The buffer circuit of this example includes n sets of the complementary P-channel MOS transistors $Q_{P1}$ to $Q_{Pn}$ and the N-channel transistors $Q_{N1}$ to $Q_{Nn}$. Respective drains of the n pieces of P-channel MOS transistors $Q_{P1}$ to $Q_{Pn}$ are directly connected to the output terminal 2 and the fuses (fuse means) $F_{P1}$ to $F_{Pn}$ are respectively connected between respective sources of the n pieces of the P-channel MOS transistors $Q_{P1}$ to $Q_{Pn}$ and power source $V_{DD}$. Moreover, respective drains of the n pieces of the N-channel MOS transistors $Q_{N1}$ to $Q_{Nn}$ are directly connected to the output terminal 2 and the fuses (fuse means) $Q_{N1}$ to $F_{Nn}$ are respectively connected between respective sources of the n pieces of N-channel MOS transistors $Q_{N1}$ to $Q_{Nn}$ and the ground GND.

In this example, the PMOS selection circuit 4 includes n−1 pieces of the P-channel MOS transistors $Q_{P2}$ to $Q_{Pn}$ and the NMOS selection circuit 5 includes n−1 pieces of the N-channel MOS transistors $Q_{N2}$ to $Q_{Nn}$ as shown in the second example. Moreover, the P-channel MOS transistor $Q_{P1}$ which serves as the main PMOS and the N-channel MOS transistor $Q_{N1}$ which serves as the main NMOS are connected to the fuse $F_{P1}$ and the fuse $Q_{N1}$, respectively. Accordingly, the main PMOS and the main NMOS are not specially different from the adjustable PMOS and the adjustable NMOS.

In this buffer circuit, any MOS transistor can be separated from the circuit by selectively disconnecting (cutting) the fuses $F_{P1}$ to $F_{Pn}$ and $Q_{N1}$ to $F_{Nn}$. Accordingly, the circuit characteristics can be corrected as shown in the first and second examples, in the case where the process constants deviate from the desired value due to the unevenness of the fabrication processes.

In this example, the pull-up resistors $R_{P2}$ to $R_{Pn}$ and the pull-down resistors $R_{N2}$ to $R_{Nn}$ are not required as shown in the second example.

Example 6

Figure 10:
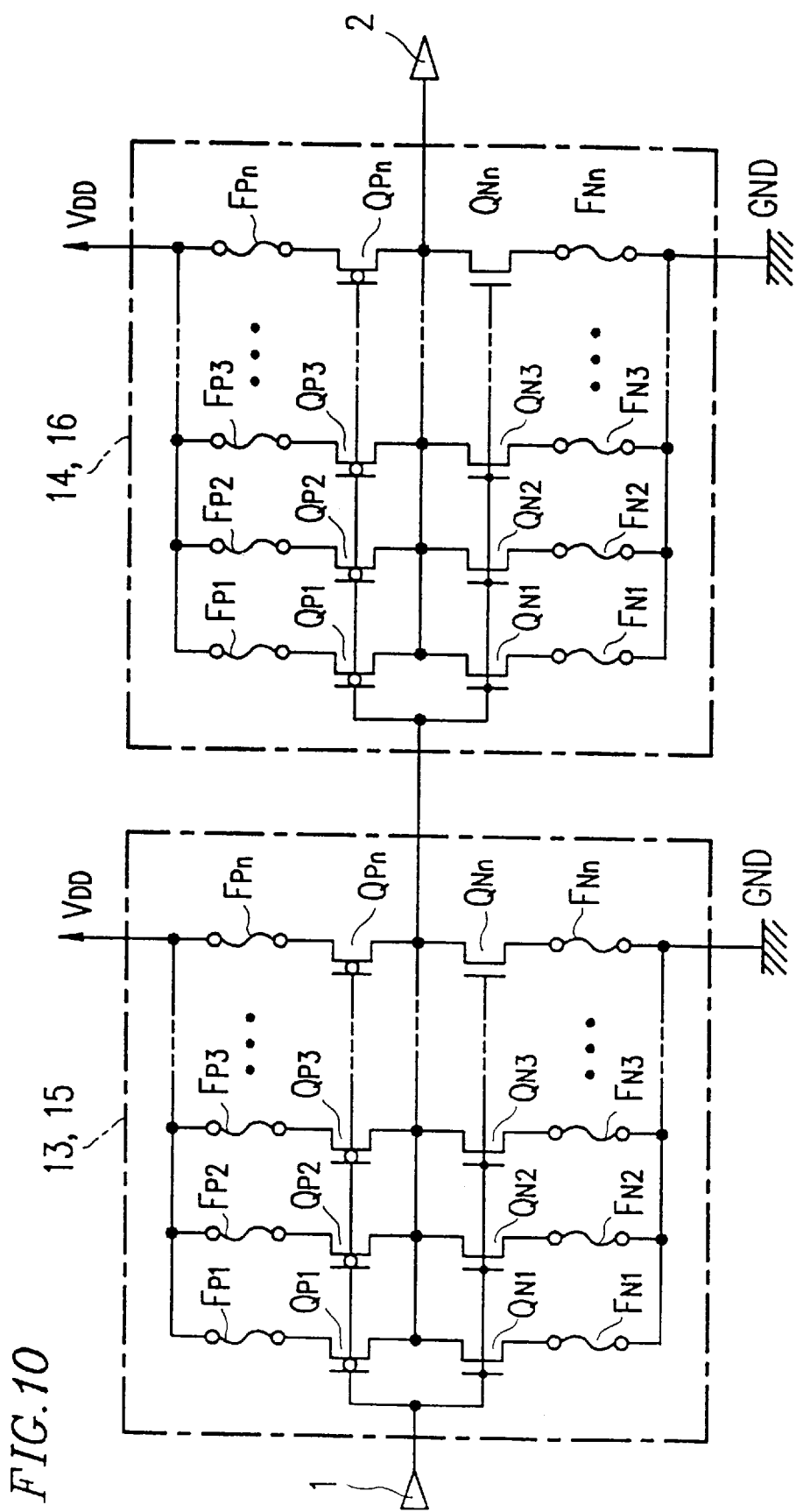
FIG. 10 is a diagram of a buffer circuit of the sixth example of the present invention, the buffer circuit being used as an inverter circuit of an output buffer in FIG. 5.

FIGS. 5 and 10 show a sixth example of the present invention. The same reference numerals will be attached to structural members of these figures which have the same functions as those in the fifth example shown in FIG. 9, and the explanations thereof will be omitted.

The buffer circuit shown in FIG. 5 uses four inverter circuits 13 to 16. The inverter circuits 13 and 14 also shown in FIG. 10 are connected to the gate of the output transistor $Q_{Pa}$ and the inverter circuits 15 and 16 also shown in FIG. 10 are connected to the gate of the output transistor $Q_{Na}$. As shown in FIG. 10, each of the inverter circuits 13, 14, 15, and 16 have the same structures as those of the fifth example shown in FIG. 9.

In this example, when the data input to the data input terminal 10 is switched from a low level to a high level while the output permitting terminal 12 is in a low level, the output of the inverter circuit 14 is varied from a high level to a low level, so that the output transistor $Q_{Pa}$ becomes ON. When the drive ability of the inverters 13 and 14 exceeds the required value due to the unevenness of the fabrication processes of the output buffer, the output voltage of the inverter 14 rapidly changes, as shown in FIG. 7. As a result, the output voltage of the output transistor $Q_{Pa}$ also rapidly changes.

When the drive ability of the inverter circuits 13 and 14 is reduced by selectively disconnecting (cutting) the fuses (fuse means) $F_{P1}$ to $F_{Pn}$ and $F_{N1}$ to $F_{Nn}$ of the inverter circuits 13 and 14, a change in the output voltage of the inverter circuit 14 becomes slow as shown in FIG. 8. Therefore, the output voltage of the output transistor $Q_{Pa}$ is gradually raised. Furthermore, the output voltage of the output transistor $Q_{Na}$ can be adjusted in the same manner by reducing the drive ability of the inverter circuits 15 and 16.

Accordingly, in this example, by prolonging the delay time of the buffer circuit, the change rate of the current flowing through the output transistors $Q_{Pa}$ and $Q_{Na}$ can be reduced. As a result, the occurrence of noise can be restrained.

Example 7

Figure 11:
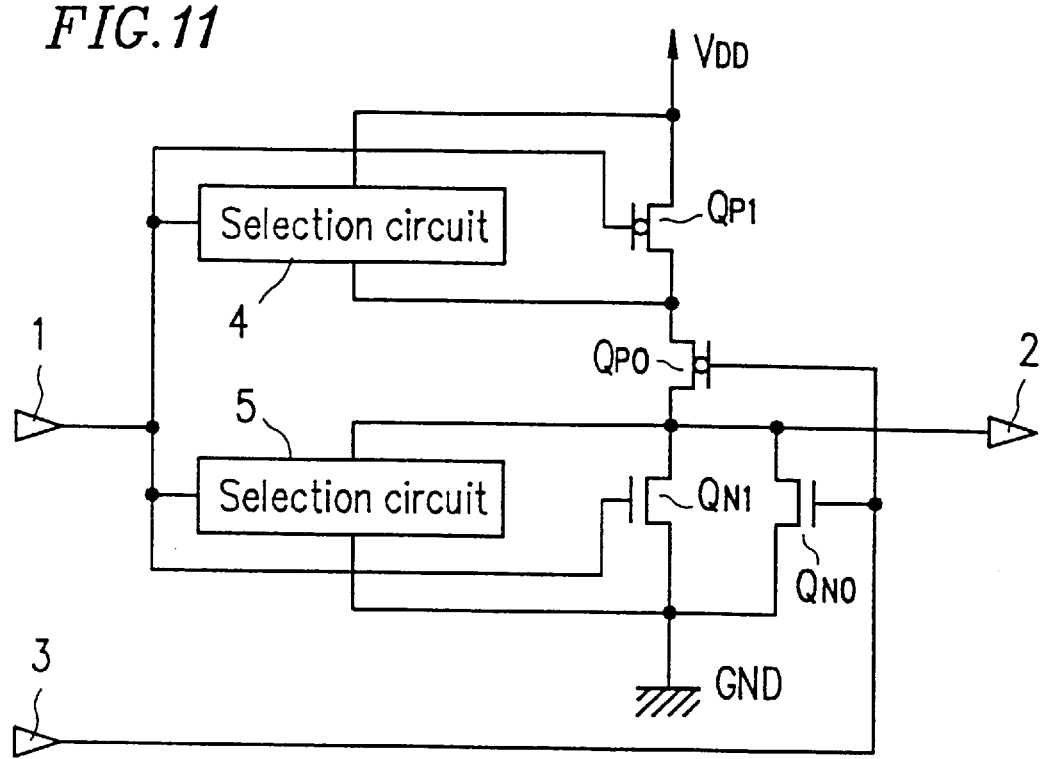
FIG. 11 is a schematic diagram of a seventh example of the present invention.
Figure 12:
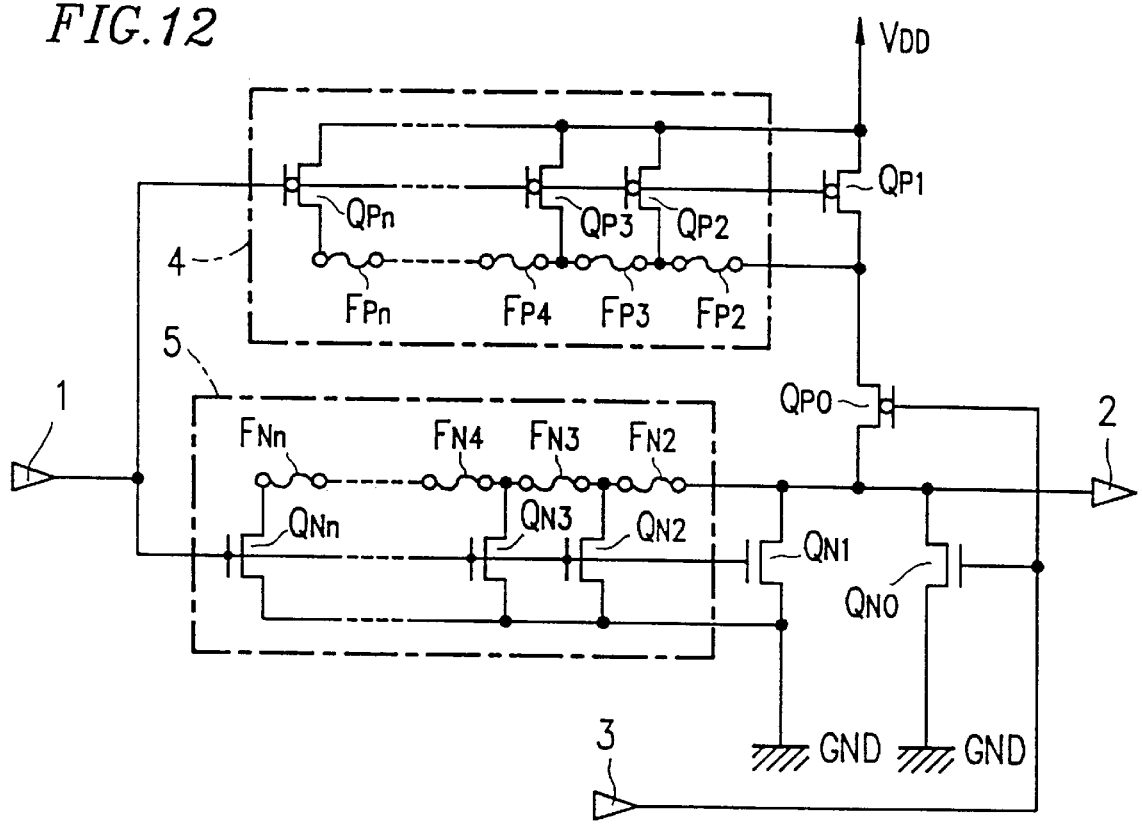
FIG. 12 is a diagram of the seventh example of the present invention.

FIGS. 11 and 12 show a seventh example of the present invention. FIG. 11 is a schematic diagram of the buffer circuit, and FIG. 12 is a diagram of the buffer circuit. The same reference numerals will be attached to structural members of these figures which have the same functions as those in the first and second examples as shown in FIGS. 1 to 3, and the explanations thereof will be omitted.

The buffer circuit of this example includes the PMOS selection circuit 4 and the NMOS selection circuit 5, in which the fuse means is connected to the drains of the adjustable PMOS and the adjustable NMOS.

This buffer circuit includes an output control means having a P-channel MOS transistor $Q_{P0}$ which serves as a sub PMOS and an N-channel MOS transistor $Q_{N0}$ which serves as a sub NMOS. The P-channel MOS transistor $Q_{P0}$ has a drain connected to the output terminal 2 and a source connected to the drain of the P-channel MOS transistor $Q_{P1}$ which serves as the main PMOS. The N-channel MOS transistor $Q_{N0}$ has a source and a drain respectively connected to the source and the drain of the N-channel MOS transistor $Q_{N1}$ which serves as the main NMOS. A gate of the P-channel MOS transistor $Q_{P0}$ and a gate of the N-channel MOS transistor $Q_{N0}$ are connected in common to the control input terminal 3. Both of the drains of $Q_{N0}$ and $Q_{N1}$ are connected to the output terminal 2.

In the PMOS selection circuit 4 of this example, the drains and the fuse means are connected to each other in a different way from that of the second example as shown in FIG. 3. This PMOS selection circuit 4 includes n–1 pieces of P-channel MOS transistors $Q_{P2}$ to $Q_{Pn}$. Respective sources of the P-channel MOS transistors $Q_{P2}$ to $Q_{Pn}$ are connected in common to the source of the MOS transistors $Q_{P1}$ and the power source $V_{DD}$, and respective gates thereof are connected in common to the gate of the MOS transistor $Q_{P1}$ and the input terminal 1. The drain of the n-th P-channel MOS transistor $Q_{Pn}$ and the drain of the P-channel MOS transistor $Q_{P1}$ are connected to each other via a series circuit of n–1 pieces of fuses $F_{P2}$ to $F_{Pn}$. The drain of the n-th P-channel MOS transistors $Q_{Pn}$ is connected to the drain of the (n–1)th MOS $Q_{Pn-1}$ via the n-th fuse $F_{Pn}$.

The NMOS selection circuit 5 includes n—1 pieces of N-channel MOS transistors $Q_{N2}$ to $Q_{Nn}$ as shown in FIG. 12. Respective sources of the N-channel MOS transistors $Q_{N2}$ to $Q_{Nn}$ are connected in common to the source of the N-channel MOS transistor $Q_{N1}$ and the ground GND, and respective gates thereof are connected in common to the gate of the N-channel MOS transistor $Q_{N1}$ and the input terminal 1. The drain of the n-th N-channel MOS transistor $Q_{Nn}$ and the drain of the N-channel MOS transistor $Q_{N1}$ are connected to each other via a series circuit of n–1 pieces of fuses $F_{N2}$ to $F_{Nn}$. The drain of the n-th N-channel MOS transistors $Q_{Nn}$ is connected to the drain of the (n–1)th MOS $Q_{Nn-1}$ via the n-th fuse $F_{Nn}$.

In the above buffer circuit, when the control input terminal 3 is in a low level, the P-channel MOS transistor $Q_{P0}$ becomes ON and the N-channel MOS transistor $Q_{N0}$ becomes OFF. Moreover, as shown in the first and second examples, the total P-channel MOS transistors $Q_{P1}$ to $Q_{Pn}$ and the total N-channel MOS transistors $Q_{N1}$ to $Q_{Nn}$ function as the inverter which inverts the logic level inputted to the input terminal 1 and outputs the inverted level to the output terminal 2. Alternatively, when the control input terminal 3 is in a high level, the P-channel MOS transistor $Q_{P0}$ becomes OFF and the N-channel MOS transistor $Q_{N0}$ becomes ON, so that the output terminal 2 is always in a low level. As a result, the function of the inverter becomes inactive.

In this buffer circuit, for example, when i-th fuse $F_{Pi}$ of n–1 pieces of fuses (fuse means) $F_{P2}$ to $F_{Pn}$ is disconnected (cut) in the PMOS selection circuit 4, the P-channel MOS transistors $Q_{Pi}$ to $Q_{Pn}$ (i.e., all of the P-channel MOS transistors after the i-th one) are also disconnected, and the residual i–1 pieces of P-channel MOS transistors $Q_{P1}$ to $Q_{Pi-1}$ operate. As a result, the gain constant $\beta_P$ is substantially reduced. In this case, the total drive ability of the P-channel MOS transistors is reduced and the input inversion voltage $V_{INV}$ of the inverter can be reduced. When j-th fuse $F_{Nj}$ of n–1 pieces of fuses (fuse means) $F_{N2}$ to $F_{Nn}$ is disconnected in the NMOS selection circuit 5, the N-channel MOS transistors $Q_{Nj}$ to $Q_{Nn}$ (i.e., all of the N-channel MOS transistors after the j-th one) are also disconnected, and the residual j—1 pieces of N-channel MOS transistors $Q_{N1}$ to $Q_{Nj-1}$ operate. As a result, the gain constant $\beta_N$ is substantially reduced. In this case, the total drive ability of the total N-channel MOS transistors is reduced and the input inversion voltage $V_{INV}$ of the inverter can be improved.

Accordingly, also in the buffer circuit of this example, the arbitrary number of the MOS transistors can be separated from the circuit by selectively disconnecting (cutting) any one of the fuses $F_{P2}$ to $F_{Pn}$ or the fuses $F_{N2}$ to $F_{Nn}$. Thus, the circuit characteristics can be corrected, in the case where the process constants deviate from the desired value due to the unevenness of the fabrication processes.

Example 8

Figure 13:
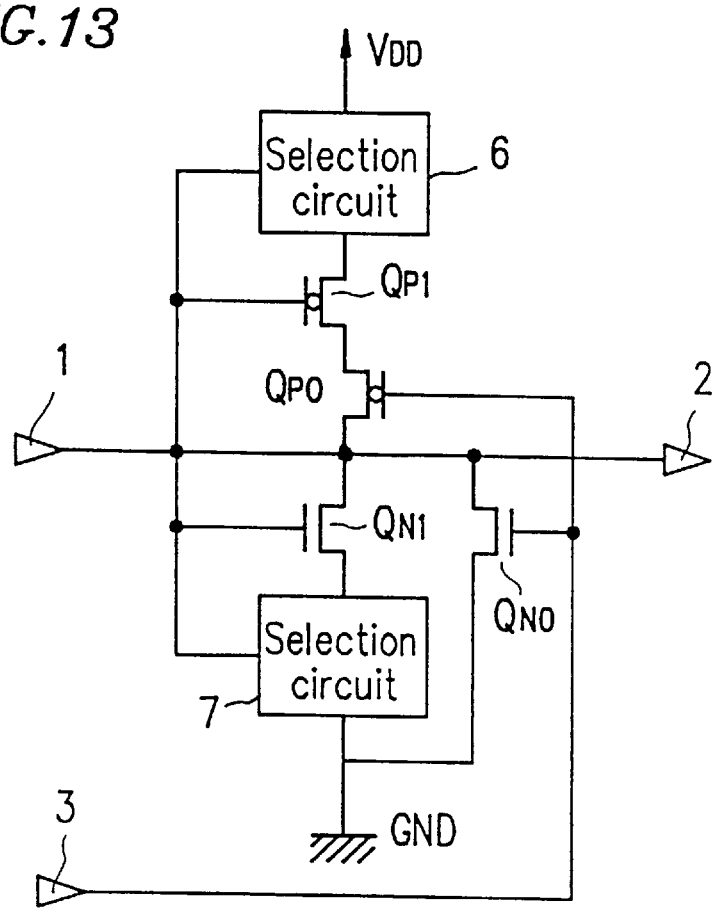
FIG. 13 is a schematic diagram of a buffer circuit of an eighth example of the present invention.
Figure 14:
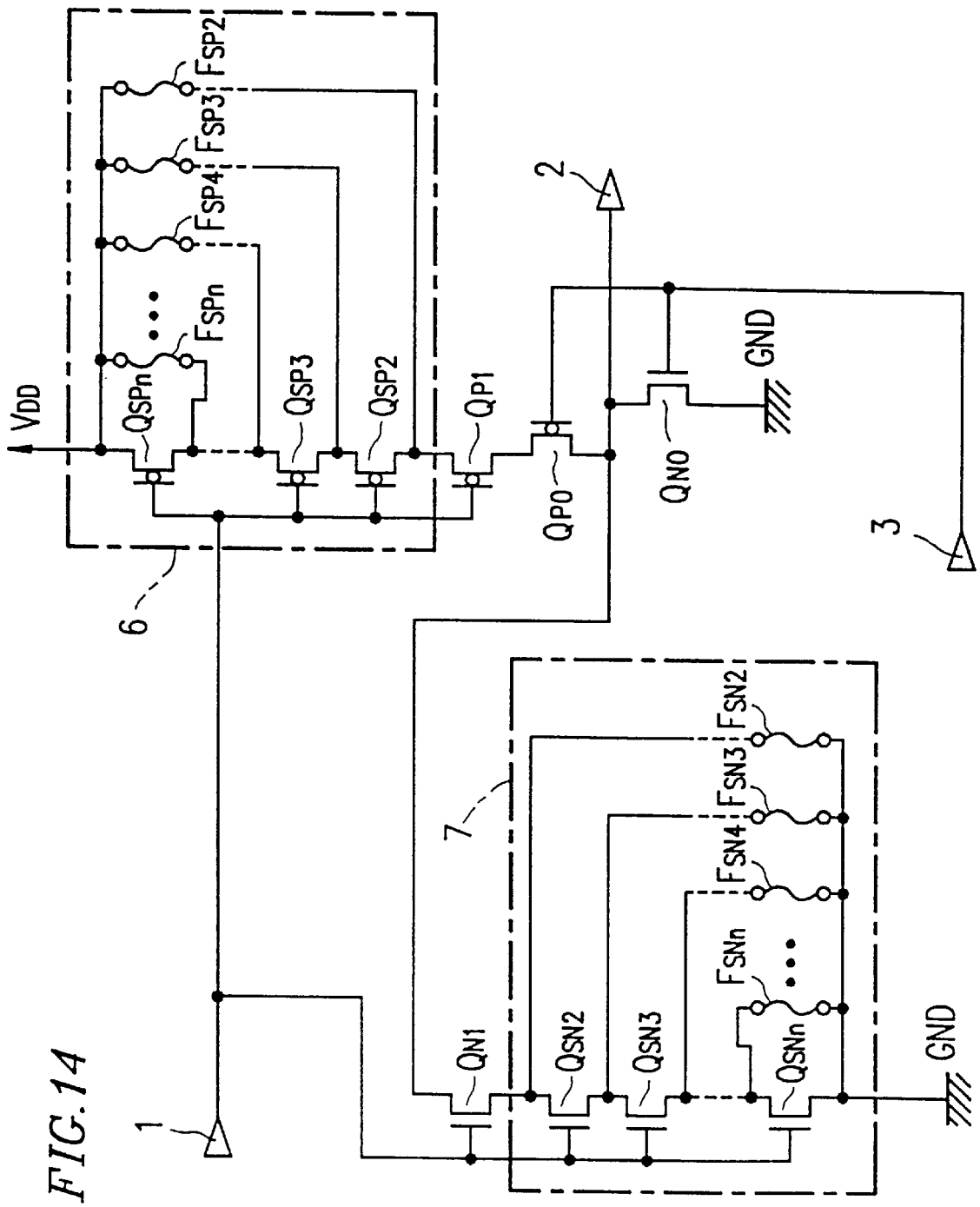
FIG. 14 is a diagram of a buffer circuit of an eighth example of the present invention.

FIGS. 13 and 14 show an eighth example of the present invention. FIG. 13 is a schematic diagram of the buffer circuit, and FIG. 14 is a diagram of the buffer circuit. The same reference numerals will be attached to structural members of these figures which have the same functions as those in the seventh example as shown in FIGS. 11 and 12, and the explanations thereof will be omitted.

19

The buffer circuit of this example includes a series PMOS selection circuit 6 and a series NMOS selection circuit 7.

In the buffer circuit of this example, as shown in FIG. 13, in place of the PMOS selection circuit 4 and the NMOS selection circuit 5 shown in FIG. 11, a series PMOS selection circuit 6 and a series NMOS selection circuit 7 are connected to the sources of the P-channel MOS transistor $Q_{P1}$ and the N-channel MOS transistor $Q_{N1}$, respectively. The gates of the transistors $Q_{P1}$ and $Q_{N1}$ are connected to the input terminal 1. The drain of the transistor $Q_{P1}$ is connected to the source of the sub PMOS transistor $Q_{P0}$, and the drain and the gate of the transistor $Q_{P0}$ are connected to the output terminal 2 and the control input terminal 3, respectively. Both of the drains of the transistors $Q_{N1}$ and $Q_{N0}$ are connected to the output terminal 2. The source and the gate of the transistor $Q_{N0}$ are connected to the ground GND and the control input terminal 3, respectively.

The series PMOS selection circuit 6 includes n−1 pieces of the P-channel MOS transistors $Q_{SP2}$ to $Q_{SPn}$ as shown in FIG. 14. Respective sources and drains of these P-channel MOS transistors $Q_{SP2}$ to $Q_{SPn}$ are connected in series. The source of the P-channel MOS transistor $Q_{SPn}$, which is one end of the series connection, is connected to the power source $V_{DD}$ and the drain of the second P-channel MOS transistor $Q_{SP2}$, which is the other end of the series connection, is connected to the source of the P-channel MOS transistor $Q_{P1}$ which serves as the main PMOS. Respective gates of the P-channel MOS transistors $Q_{SP2}$ to $Q_{SPn}$ are connected in common to the gate of the P-channel MOS transistor $Q_{P1}$ and the input terminal 1, and respective drains thereof are connected to the power source $V_{DD}$ via a fuse means (the drain of the n-th PMOS transistor is connected to the power source $V_{DD}$ via the n-th fuse $F_{SPn}$).

The series NMOS selection circuit 7 includes n−1 pieces of the N-channel MOS transistors $Q_{SN2}$ to $Q_{SNn}$ as shown in FIG. 14. Respective sources and drains of these N-channel MOS transistors $Q_{SN2}$ to $Q_{SNn}$ are connected in series. The source of the N-channel MOS transistor $Q_{SNn}$, which is one end of the series connection, is connected to the ground GND, and the drain of the second N-channel MOS transistor $Q_{SN2}$, which is the other end of the series connection, is connected to the source of the N-channel MOS transistor $Q_{N1}$ which serves as the main NMOS. Respective gates of the N-channel MOS transistors $Q_{SN2}$ to $Q_{SNn}$ are connected in common to the gate of the N-channel MOS transistor $Q_{N1}$ and the input terminal 1, and respective drains thereof are connected to the ground GND via a fuse means (the drain of the n-th NMOS transistor is connected to the ground GND via the n-th fuse $F_{SNn}$).

In the above buffer circuit, when the control input terminal 3 is in a low level, the inverter becomes active and when the control input terminal 3 is in a high level, the output terminal 2 is always in a low level, so that the inverter becomes inactive. In this point, this buffer circuit has the same function as that of the sixth example. However, while none of the fuses (fuse means) $F_{SP2}$ to $F_{SPn}$ is disconnected (cut), the P-channel MOS transistors $Q_{SP2}$ to $Q_{SPn}$ are all disconnected from the series PMOS selection circuit 6, whereby the source of the P-channel MOS transistor $Q_{P1}$ is directly connected to the power source $V_{DD}$. Furthermore, while none of the fuses (fuse means) $F_{SN2}$ to $F_{SNn}$ is disconnected, the N-channel MOS transistors $Q_{SN2}$ to $Q_{SNn}$ are all disconnected from the series NMOS selection circuit 7, whereby the source of the N-channel MOS transistor $Q_{N1}$ is directly connected to the ground GND.

In this buffer circuit, when the fuses $F_{SP2}$ to $F_{SPn}$ are all disconnected, the P-channel MOS transistor $Q_{P1}$ and the

20

P-channel MOS transistors $Q_{SP2}$ to $Q_{SPn}$ operate together. In this case, a substantial channel length equals the total channel length of all the PMOS transistors, and the gain constant is reduced as shown from Equations (4) and (5). Furthermore, when the fuses $F_{SN2}$ to $F_{SNn}$ are all disconnected, the N-channel MOS transistor $Q_{N1}$ and the N-channel MOS transistors $Q_{SN2}$ to $Q_{SNn}$ operate together. In this case, a substantial channel length equals the total channel length of all the NMOS transistors, and the gain constant is reduced. For example, when the fuses $F_{SP2}$ to $F_{Spi}$ (i-th fuse means) are all disconnected in the series PMOS selection circuit 6, the P-channel MOS transistors $Q_{SPi+1}$ to $Q_{SPn}$ (i.e., all of the P-channel MOS transistors after the i-th one) are all disconnected. Then, the residual i−1 pieces of P-channel MOS transistors $Q_{SP2}$ to $Q_{SPi}$ and the P-channel MOS transistor $Q_{P1}$ operate. As a result, the gain constant $\beta_P$ is substantially increased, compared with the case where all the fuses $F_{SP2}$ to $F_{SPn}$ are disconnected, thereby improving the input inversion voltage $V_{INV}$ of the inverter. Furthermore, when the fuses $F_{SN2}$ to $F_{SNj}$ (j-th fuse means) are all disconnected in the series NMOS selection circuit 7, the N-channel MOS transistors $Q_{SNj+1}$ to $Q_{SNn}$ (i.e., all of the N-channel MOS transistors after the j-th one) are all disconnected. Then, only the residual (j−1) N-channel MOS transistors $Q_{SN2}$ to $Q_{SNj}$ and the N-channel MOS transistor $Q_{N1}$ operate. As a result, the gain constant $\beta_N$ is substantially reduced, compared with a case where all the fuses $F_{SN2}$ to $F_{SNn}$ are disconnected, thereby reducing the input inversion voltage $V_{INV}$ of the inverter.

Accordingly, in the buffer circuit of this example, the arbitrary number of the MOS transistors can be separated from the circuit by disconnecting (cutting) any of the fuses $F_{SP2}$ to $F_{SPn}$ or the fuses $F_{SN2}$ to $F_{SNn}$. Thus, even though the process constants are changed due to the unevenness of the fabrication processes, the circuit characteristics can be corrected.

Figure 15:
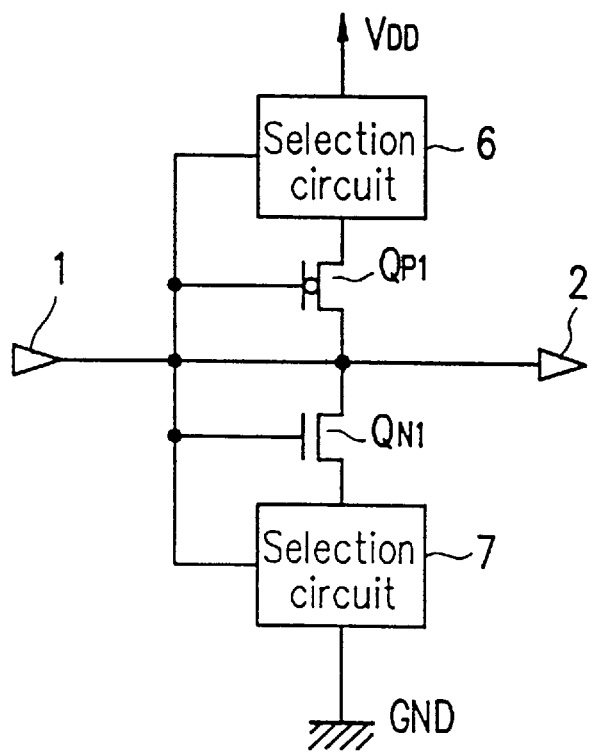
FIG. 15 is a schematic diagram of a buffer circuit in a modification example of the eighth example of the present invention.

In the buffer circuit of this example, the P-channel MOS transistor $Q_{P0}$ and the N-channel MOS transistor $Q_{N0}$ are provided, the $Q_{P0}$ and $Q_{N0}$ serving as the sub PMOS and the sub NMOS, respectively. However, as shown in FIG. 15, the sub PMOS $Q_{P0}$ and sub NMOS $Q_{N0}$ can be separated from the circuit of the eighth example.

Example 9

Figure 16:
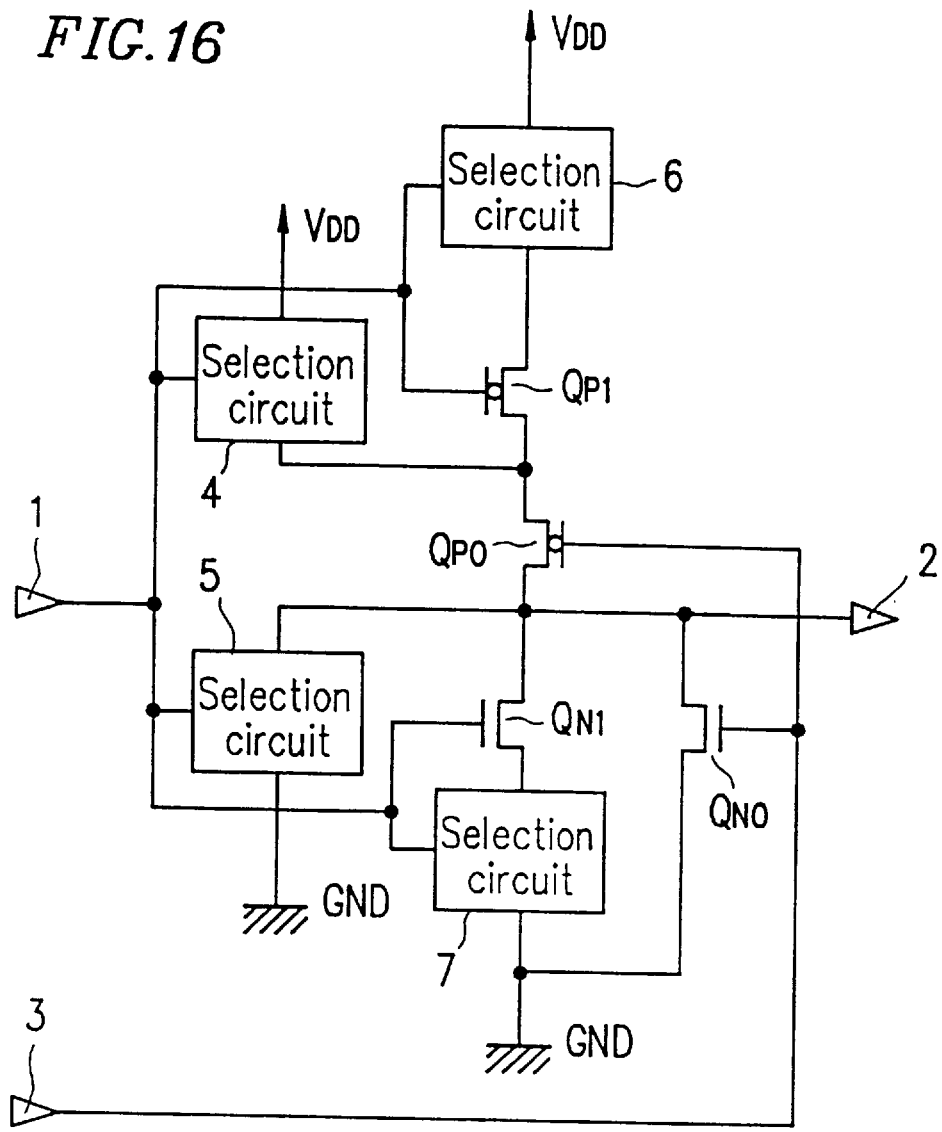
FIG. 16 is a schematic circuit diagram of a buffer circuit of a ninth example of the present invention.
Figure 17:
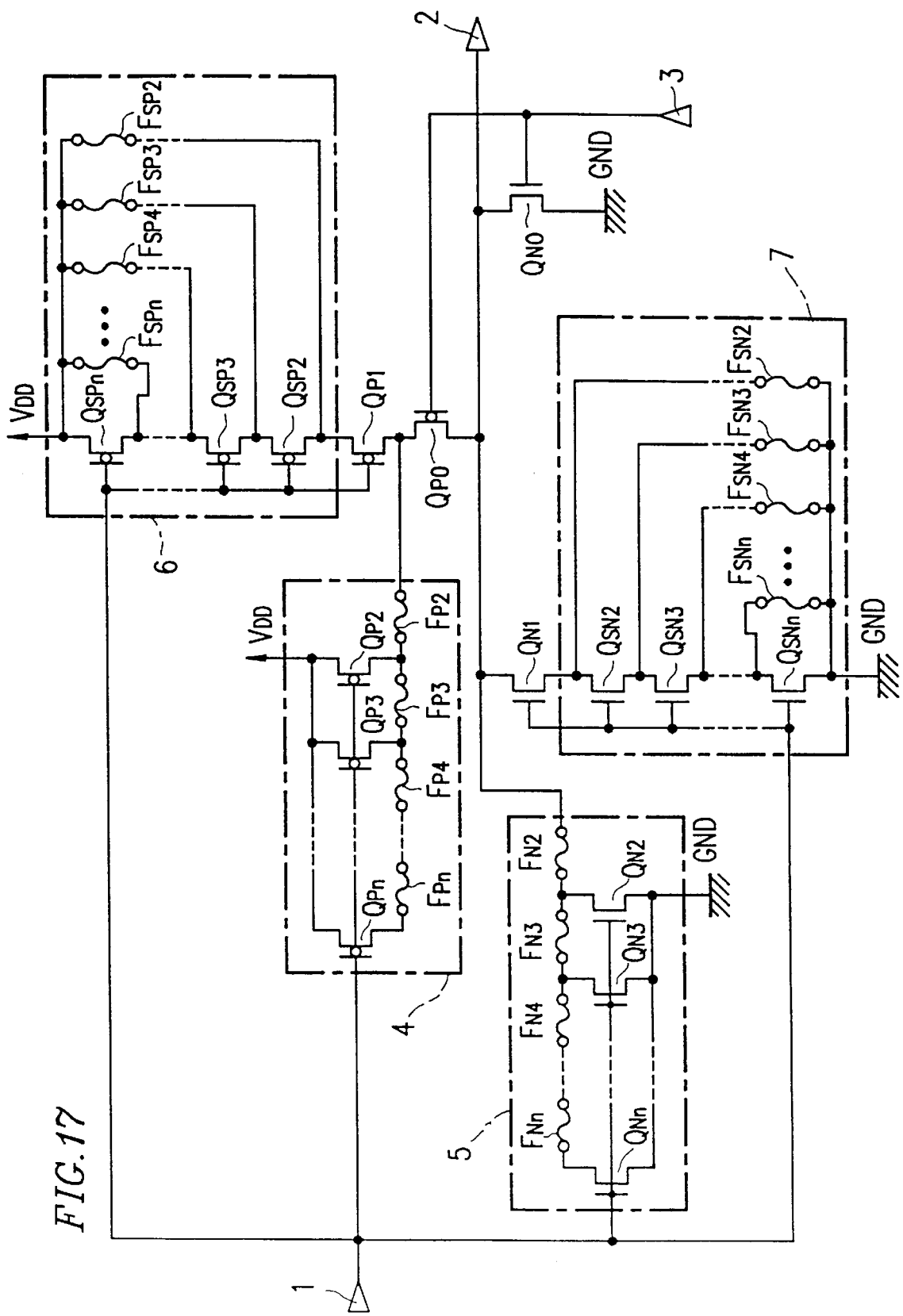
FIG. 17 is a diagram of a buffer circuit of the ninth example of the present invention.

FIGS. 16 and 17 show a ninth example of the present invention. FIG. 16 is a schematic diagram of the buffer circuit and FIG. 17 is a diagram of the buffer circuit. The same reference numerals will be attached to structural members of these figures which have the same functions as those in the seventh and eighth examples as shown in FIGS. 11 to 14, and the explanations thereof will be omitted.

The buffer circuit of this example includes the PMOS selection circuit 4, the NMOS selection circuit 5, the series PMOS selection circuit 6, and the series NMOS selection circuit 7.

As shown in FIG. 16, in this buffer circuit, the P-channel MOS transistor $Q_{P1}$ is connected in parallel to the PMOS selection circuit 4 and connected in series to the series PMOS selection circuit 6; and the N-channel MOS transistor $Q_{N1}$ is connected in parallel to the NMOS selection circuit 5 and connected to in series to the series NMOS selection circuit 7. The P-channel MOS transistor $Q_{P1}$ and the N-channel MOS transistor $Q_{N1}$ serve as the main PMOS and NMOS, respectively, and the P-channel MOS transistor $Q_{P0}$ and the N-channel MOS transistor $Q_{N0}$ which serve as the sub PMOS and NMOS, respectively. As shown in FIG. 17, the PMOS selection circuit 4 and the NMOS selection circuit 5 have the same structures as those of the seventh example in FIG. 12, and the series PMOS selection circuit 6 and the series NMOS selection circuit 7 have the same structures as those of the eighth example in FIG. 14.

In the above buffer circuit, when the control input terminal 3 is in a low level, the inverter becomes active and when the control input terminal 3 is in a high level, the output terminal 2 is always in a low level, so that the inverter becomes inactive. In this point, this buffer circuit has the same function as that of the seventh and eighth examples. Moreover, by selectively disconnecting any of the fuses (fuse means) $F_{P2}$ to $F_{Pn}$ or $F_{N2}$ to $F_{Nn}$, the gain constants $\beta_P$ and $\beta_N$ can substantially reduced. Furthermore, by selectively preventing the fuses (fuse means) $F_{SP2}$ to $F_{SPn}$ or $F_{SN2}$ to $F_{SNn}$ from being disconnected, the gain constants $\beta_P$ and $\beta_N$ can be substantially improved. As a result, the circuit characteristics of the buffer circuit can be corrected as desired.

As mentioned above, an MOS transistor is partially separated from a buffer circuit of the present invention by selectively disconnecting a fuse means or avoiding the disconnection, whereby circuit characteristics can be made optimum.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for buffering a signal via a buffer circuit comprising the steps of:

testing a performance of the buffer circuit, thereby determining one or more operational characteristics of an input circuit; and adjusting the input circuit in response to the one or more determined operational characteristics;

wherein the step of testing a performance of the buffer circuit includes the steps of:

measuring an input inversion voltage, an NMOS threshold voltage and a PMOS threshold voltage of the buffer circuit; and calculating a gain constant ratio $\beta_N/\beta_P$ for satisfying $V_{INV}=(V_{DD}+V_{TN}*\beta_N/\beta_P{}^{-\frac{1}{2}}+V_{TP})/(1+(\beta_N/\beta_P)^{-\frac{1}{2}})$ for a desired value of $V_{INV}$, wherein $V_{INV}$ is the desired input inversion voltage, $V_{DD}$ is a supply potential, $V_{TN}$ and $V_{TP}$ are the measured threshold voltages for one or more NMOS and PMOS type transistors within the buffer circuit, respectively, and $\beta_N$ and $\beta_P$ are transistor gain constants for the one or more NMOS and PMOS transistors within the buffer circuit, respectively.

2. The method of claim 1, wherein the step of adjusting the input circuit comprises adjusting a composite drive capability of a plurality of transistors within the buffer circuit.

3. The method of claim 2, wherein the step of adjusting the composite drive capability comprises modifying a composite channel length of the plurality of transistors.

4. The method of claim 2, wherein the step of adjusting the composite drive capability comprises modifying a composite channel width of the plurality of transistors.

5. The method of claim 1, further comprising modifying a composite transistor size within the buffer circuit to obtain the gain constant ratio $\beta_N/\beta_P$ for a desired input inversion voltage $V_{INV}$.

6. The method of claim 5 wherein the step of modifying the composite transistor size comprises adjusting a composite channel length or width of a plurality of NMOS transistors.

7. The method of claim 5 wherein the step of modifying the composite transistor size comprises adjusting a composite channel length or width of a plurality of PMOS transistors.

8. The method of claim 1 wherein a method for forming the buffer circuit for adjusting a gain constant ratio $\beta_N/\beta_P$ to achieve a desired input inversion voltage $V_{INV}$ over processing variations comprises the steps of:

forming the one or more NMOS transistors in parallel with each other, wherein each NMOS transistor has a source terminal coupled to a ground potential, a drain terminal coupled to an output terminal, and a gate terminal;

forming the one or more PMOS transistors in parallel with each other, wherein each PMOS transistor has a source terminal coupled to a supply potential, a drain terminal coupled to an output terminal, and a gate terminal;

coupling the gate terminal of at least one of the one or more NMOS transistors to the input terminal via a first fuse element which can be selectively and independently disconnected and any remaining gate terminals to the input terminal; and coupling the gate terminal of at least one of the one or more PMOS transistors to the input terminal via a second fuse element which can be selectively and independently disconnected and any remaining gate terminals to the input terminal, wherein the one or more NMOS transistors form an effective NMOS transistor having an effective device dimension which is a function of the device dimensions of the NMOS transistors collectively, and wherein the one or more PMOS transistors form an effective PMOS transistor having an effective device dimension which is a function of the device dimensions of the PMOS transistors collectively.

9. The method of claim 8, further comprising adjusting the gain constant ratio $\beta_N/\beta_P$ by selectively disconnecting one or more first fuses, thereby disconnecting NMOS transistors coupled to the disconnected one or more first fuses and thereby altering the effective device dimension of the NMOS transistors collectively.

10. The method of claim 8, further comprising adjusting the gain constant ratio $\beta_N/\beta_P$ by selectively disconnecting one or more second fuses, thereby disconnecting PMOS transistors coupled to the disconnected one or more second fuses and thereby altering the effective device dimension of the PMOS transistors collectively.

11. The method of claim 1 wherein a method for forming the adjustable buffer circuit for adjusting a gain constant ratio $\beta_N/\beta_P$ to achieve a desired input inversion voltage $V_{INV}$ over processing variations comprises the steps of:

forming the one or more NMOS transistors, wherein each NMOS transistor has a source terminal coupled to a ground potential, a gate terminal connected to an input terminal, and a drain terminal;

forming the one or more PMOS transistors, wherein each PMOS transistor has a source terminal coupled to a supply potential, a gate terminal connected to the input terminal, and a drain terminal;

coupling one or more first fuses between an output terminal and at least one or more corresponding drain terminals of the one or more NMOS transistors;

coupling one or more second fuses between the output terminal and at least one or more corresponding drain terminals of the one or more PMOS transistors;

coupling drain terminals of the NMOS transistors that are not coupled to one or more first fuses to the output terminal;

coupling drain terminals of the PMOS transistors that are not coupled to one or more second fuses to the output terminal;

wherein the one or more NMOS transistors form an effective NMOS transistor having an effective device dimension which is a function of the device dimensions of the NMOS transistors collectively, and wherein the one or more PMOS transistors form an effective PMOS transistor having an effective device dimension which is a function of the device dimensions of the PMOS transistors collectively.

12. The method of claim 11, further comprising adjusting the gain constant ratio $\beta_N/\beta_P$ by selectively disconnecting one or more first fuses, thereby disconnecting NMOS transistors coupled to the disconnected one or more first fuses and altering the effective device dimension of the NMOS transistors collectively.

13. The method of claim 11, further comprising adjusting the gain constant ratio $\beta_N/\beta_P$ by selectively disconnecting one or more second fuses, thereby disconnecting PMOS transistors coupled to the disconnected one or more second fuses and altering the effective device dimension of the PMOS transistors collectively.

14. The method of claim 1 wherein a method for forming the adjustable buffer circuit for adjusting a gain constant ratio $\beta_N/\beta_P$ to achieve a desired input inversion voltage $V_{INV}$ over processing variations comprises the steps of:

forming the one or more NMOS transistors, wherein each NMOS transistor has a source terminal coupled to a ground potential, a gate terminal connected to an input terminal, and a drain terminal;

forming the one or more PMOS transistors, wherein each PMOS transistor has a source terminal coupled to a supply potential, a gate terminal connected to the input terminal, and a drain terminal;

coupling one or more first fuses between an output terminal and at least one or more corresponding drain terminals of the one or more NMOS transistors;

coupling one or more second fuses between the output terminal and at least one or more corresponding drain terminals of the one or more PMOS transistors;

coupling drain terminals of the NMOS transistors that are not coupled to one or more first fuses to the output terminal;

coupling drain terminals of the PMOS transistors that are not coupled to one or more second fuses to the output terminal;

wherein the one or more NMOS transistors form an effective NMOS transistor having an effective device dimension which is a function of the device dimensions of the NMOS transistors collectively, and wherein the one or more PMOS transistors form an effective PMOS transistor having an effective device dimension which is a function of the device dimensions of the PMOS transistors collectively.

15. The method of claim 14, further comprising adjusting the gain constant ratio $\beta_N/\beta_P$ by selectively disconnecting one or more first fuses, thereby disconnecting NMOS transistors coupled to the disconnected one or more first fuses and thereby altering the effective device dimension of the NMOS transistors collectively.

16. The method of claim 14, further comprising adjusting the gain constant ratio $\beta_N/\beta_P$ by selectively disconnecting one or more second fuses, thereby disconnecting PMOS transistors coupled to the disconnected one or more second fuses and thereby altering the effective device dimension of the PMOS transistors collectively.

17. The method of claim 1 wherein a method for forming the adjustable buffer circuit for adjusting a gain constant ratio $\beta_N/\beta_P$ to achieve a desired input inversion voltage $V_{INV}$ over processing variations comprises the steps of:

forming the one or more NMOS transistors, wherein each NMOS transistor has a source terminal coupled to a ground potential, a gate terminal connected to an input terminal, and a drain terminal;

forming the one or more PMOS transistors, wherein each PMOS transistor has a source terminal coupled to a supply potential, a gate terminal connected to the input terminal, and a drain terminal;

coupling the drain terminals of the one or more NMOS transistors together via a plurality of first fuses, wherein a junction between each first fuse connects to a corresponding drain terminal;

coupling the drain terminals of the one or more PMOS transistors together via a plurality of second fuses, wherein a junction between each second fuse connects to a corresponding drain terminal;

wherein the one or more NMOS transistors form an effective NMOS transistor having an effective device dimension which is a function of the device dimensions of the NMOS transistors collectively, and wherein the one or more PMOS transistors form an effective PMOS transistor having an effective device dimension which is a function of the device dimensions of the PMOS transistors collectively.

18. The method of claim 17, further comprising adjusting the gain constant ratio $\beta_N/\beta_P$ by selectively disconnecting one of the first fuses, thereby disconnecting one or more NMOS transistors from the effective NMOS transistor, thereby altering the effective device dimension of the NMOS transistors collectively.

19. The method of claim 17, further comprising adjusting the gain constant ratio $\beta_N/\beta_P$ by selectively disconnecting one of the second fuses, thereby disconnecting one or more PMOS transistors from the effective PMOS transistor, thereby altering the effective device dimension of the PMOS transistors collectively.

20. The method of claim 1 wherein a method for forming the adjustable buffer circuit for adjusting a gain constant ratio $\beta_N/\beta_P$ to achieve a desired input inversion voltage $V_{INV}$ over processing variations comprises the steps of:

forming the one or more NMOS transistors in series, wherein one or more of the NMOS transistors has a first fuse coupled between a drain terminal and a ground potential and a gate terminal connected to an input terminal;

forming the one or more PMOS transistors in series, wherein one or more of the PMOS transistors has a second fuse coupled between a drain terminal and a supply potential and a gate terminal connected to an input terminal;

wherein the one or more series connected NMOS transistors form an effective NMOS transistor having an effective device dimension which is a function of the device dimensions of the NMOS transistors collectively, and wherein the one or more series connected PMOS transistors form an effective PMOS transistor having an effective device dimension which is a function of the device dimensions of the PMOS transistors collectively.

21. The method of claim 20, further comprising adjusting the gain constant ratio $\beta_N/\beta_P$ by selectively disconnecting one or more of the first fuses, thereby altering the effective device dimension of the NMOS transistors collectively.

22. The method of claim 20, further comprising adjusting the gain constant ratio $\beta_N/\beta_P$ by selectively disconnecting one or more of the second fuses, thereby altering the effective device dimension of the PMOS transistors collectively.

23. The method of claim 1, further comprising a plurality of fuses, wherein at least one of the plurality fuses is connected and/or disconnected to adjust the characteristics of the input circuit.

\* \* \* \* \*